United States Patent [19]

Okayama

[11] Patent Number: 5,383,108
[45] Date of Patent: Jan. 17, 1995

[54] INVERTER APPARATUS

[75] Inventor: Hideo Okayama, Amagasaki, Japan

[73] Assignee: Mitsubishi Denki Kabushiki Kaisha, Tokyo, Japan

[21] Appl. No.: 893,326

[22] Filed: Jun. 3, 1992

[30] Foreign Application Priority Data

Jun. 6, 1991 [JP] Japan .................................. 3-134932

[51] Int. Cl.6 .......................................... H02M 7/521
[52] U.S. Cl. ...................................... 363/137; 363/58
[58] Field of Search ................ 363/131, 132, 135, 136, 363/138, 41, 43, 45, 56, 137, 58, 98, 96

[56] References Cited

U.S. PATENT DOCUMENTS 4,639,850  1/1987  Asaeda et al. .
4,710,862 12/1987  Asaeda .

FOREIGN PATENT DOCUMENTS

0299339A1  1/1989  European Pat. Off. .
3915510A1 11/1990  Germany .
3833700C2 12/1990  Germany .

OTHER PUBLICATIONS

"Megawatt GTO-Inverterw with Three Level PWM Control and Regenerative Snubber Circuit", Joachim Holtz and Samir F. Salama, PESC '88 Record, Apr. 1988.

Primary Examiner—Steven L. Stephan
Assistant Examiner—Nicholas Ponomarenko
Attorney, Agent, or Firm—Wolf, Greenfield & Sacks

[57] ABSTRACT

A multi-level inverter apparatus comprises: first and second GTOs connected in series between a positive electrode of a D.C. power supply having a mid-potential point and an output terminal, and third and fourth GTOs connected in series between a negative electrode of the D.C. power supply and the output terminal. First and second reactors cooperate with the first and second GTOs and the third and fourth GTOs so as to form a positive and negative arms, respectively. A first diode is connected between one end of the first reactor and the mid-potential point of the D.C. power supply in forward direction with respect to the output terminal, while a second diode is connected between one end of the second reactor and the mid-potential point of the D.C. power supply in backward direction with respect to the output terminal. First to fourth series connections, each including a diode and a capacitor connected in series to each other, are connected in parallel with the first to fourth GTOs, respectively. First and second discharge resistors are associated with the first to fourth series connections to consume energy discharged from the capacitors.

14 Claims, 19 Drawing Sheets

FIG. 2

| LINE NO. | LINE |
|---|---|
| 21 | 3b - 3a - 1a - 7a - 1b - A |
| 22 | 3b - 3a - 11a - 12a - 7a - 1b - A |
| 23 | 3b - 5a - 1b - A |
| 24 | 11c - 18a - 12a - 7a - 1b - 12c - 11c |
| 25 | 7a - 1b - 12c - 18a - 12a - 7a |
| 26 | 3b - 5a - 11b - 12b - A |
| 27 | 2d - 7b - 2c - A |
| 28 | 11d - 18d - 12b - 1c - 7b - 1d - 11d |
| 29 | 7b - 12d - 18b - 12b - 1c - 7b |
| 30 | 11b - 1b - 1c - 7b - 12d - 18b - 11b |
| 31 | 3b - 5a - 1b - 1c - 7b - 12d - 11d - 3b |
| 32 | 11a - 1a - 7a - 1b - 12c - 18a - 11a |
| 33 | 3a - 1a - 7a - 1b - 12c - 11c - 5b - 3a |

FIG. 4

| LINE NO. | LINE |
|---|---|
| 41 | 3b-3a-1a-7a-1b-A |
| 42 | 3b-3a-11a-12a-7a-1b-A |
| 43 | 1f-11c-18a-12a-7a-1b-A |
| 44 | 11e-18a-12a-7a-1b-A |
| 45 | 11c-18a-12a-7a-1b-1c-11c |
| 46 | 11e-18a-12a-7a-1b-1c-5b-11e |
| 47 | 7a-1b-12c-18a-12a-7a |
| 48 | 3b-5a-1b-A |
| 49 | 3b-5a-11b-12b-A |
| 50 | 11d-18b-12b-A |
| 51 | 3b-11f-12f-2c-A |
| 52 | 11d-18b-12b-1c-7b-1d-11d |
| 53 | 7b-12d-8b-12b-1c-7b |
| 54 | 2d-7b-2c-A |
| 55 | 1b-1c-7b-12d-11d |
| 56 | 1b-1c-7b-12d-18b-11f |
| 57 | 1b-1c-7b-12d-18b-11b |
| 58 | 11b-1b-1c-7b-12d-18b-11b |
| 59 | 1a-7a-1b-12c-11c |
| 60 | 1a-7a-1b-12c-18a |
| 61 | 1a-7a-12e-11e |
| 62 | 11a-1a-7a-1b-12c-18a-11a |

| LINE NO. | LINE |
|---|---|
| 71 | 3b-3a-1a-7a-1b-A |
| 72 | 3b-3a-11a-12a-7a-1b-A |
| 73 | 11f-12f-11c-18a-12a-7a-1b-A |
| 74 | 11e-18a-12a-7a-1b-A |
| 75 | 11c-18a-12a-7a-1b-1c-11c |
| 76 | 11f-5a-1b-1c-7b-12d-18b-11f |
| 77 | 7a-1b-12c-18a-12a-7a |
| 78 | 7b-12d-18b-12b-1c-7b |
| 79 | 3b-5a-1b-A |

FIG. 8

| LINE NO. | LINE |
|---|---|
| 81 | 3b- 3a- 1a- 7a- 1b- A |
| 82 | 3b- 3a-11a-12a- 7a- 1b- A |
| 83 | 1f -11c-21b-19a-12a- 7a- 1b- A |
| 84 | 11e-21c-19a-12a- 7a- 1b- A |
| 85 | 11c-21b-19a-12a- 7a-1b- 1c-11c |
| 86 | 11e-21c-19a-12a- 7a- 1b- 1c-5b-11e |
| 87 | 7a- 1b-12c-21b-19a-12a- 7a |
| 88 | 3b- 5a- 1b- A |
| 89 | 3b- 5a-11b-12b- A |
| 90 | 11d-19b-21a-12b- A |
| 91 | 11f -12f- 2c- A |
| 92 | 11d-19b-21a-12b- 1c- 7b- 1d-11d |
| 93 | 7b-12d-19b-21a-12b- 1c - 7b |
| 94 | 2d- 7b- 2c- A |
| 95 | 1b- 1c- 7b -12d- 11d |
| 96 | 1b- 1c- 7b -12d-19b-21d- 11f |
| 97 | 1b- 1c- 7b -12d-19b-21a-11b |
| 98 | 11b- 1b- 1c- 7b-12d-19b-21a-11b |
| 99 | 1a- 7a- 1b-12c -11c |
| 100 | 1a- 7a-12e -11e |
| 101 | 1a- 7a- 1b-12c-21b-19a -11a |
| 102 | 11a- 1a- 7a- 1b-12c-21b-19a-11a |

FIG. 22
PRIOR ART

| LINE NO. | LINE |
|---|---|
| 1 | 3b - 3a - 7a - 1a - 1b - A |
| 2 | 3b - 3a - 7a - 12a - 11a - 1b - A |
| 3 | 3b - 7c - 5a - 1b - A |
| 4 | 3a - 7a - 16a - 15a |
| 5 | 13d - 11d - 13c - 11c - A |
| 6 | 11c - 1c - 13c - 11c |
| 7 | 3b - 7c - 5a - 12b - 11b - A |
| 8 | 7b - 2d - 2c - A |
| 9 | 7c - 16b - 15b |
| 10 | 7b - 13d - 11d - 2c - A |
| 11 | 11d - 1d - 13d - 11d |
| 12 | 11b - 13b - 1b - 11b |
| 13 | 3b - 7c - 5a - 1b - 1c - 11d - 12d - 7b - 3b |
| 14 | 7c - 16b - 15b - 7b - 3b - 7c |
| 15 | 11a - 13a - 1a - 11a |
| 16 | 3a - 7a - 1a - 1b - 11c - 12c - 5b - 7c - 3a |
| 17 | 7a - 16a - 15a - 7c - 3a |

INVERTER APPARATUS

BACKGROUND OF THE INVENTION

1. FIELD OF THE INVENTION

The present invention relates to an inverter apparatus which incorporates semiconductor devices of self-arc-suppressing type.

2. DESCRIPTION OF THE RELATED ART

FIG. 17 illustrates a known 3-phase 3-level inverter apparatus. This type of 3-level inverter apparatus is disclosed, for example, in IEEE TRANSACTION ON INDUSTRY APPLICATIONS VOL. IA-17, No. 5 1981 "A New Neutral-Point-Clamped PWM Inverter". This 3-level inverter apparatus has self-arc-suppressing type semiconductor devices 1a to 1d connected between a positive electrode P and a negative electrode N of a D.C. power supply 3, and free-wheel diodes 2a to 2d connected in an anti-parallel manner to the semiconductor devices 1a to 1d. Two parallel circuits, each having one semiconductor device and one free-wheel diode, are connected in series as a positive arm between an output terminal A of the inverter apparatus and the positive electrode P of the D.C. power supply 3. Similarly, two parallel circuits, each having one semiconductor device and one free-wheel diode, are connected in series as a negative arm between the output terminal A and the negative electrode N of the D.C. power supply. This 3-level inverter apparatus employs capacitors 4a, 4b as means for dividing the voltage of the D.C. power supply 3. Clamp diodes 5a and 5b are respectively connected between a neutral potential point B of the D.C. power supply 3 and the neutral point C of the positive arm and between the neutral potential point B and the neutral point D of the negative arm.

FIG. 18 illustrates an ordinary 2-level inverter apparatus. Only one phase portion of the apparatus is shown for the purpose of clarification of the drawings. In this inverter, each phase can provide an output which is switchable between the full level and zero level of the D.C. power supply voltage E. In the case of a 3-level inverter apparatus shown in FIG. 19, however, it is possible to obtain, from each phase, an output the level of which is full of the D.C. power supply voltage 2E, an intermediate voltage or zero volt. A description will be given of the operation of this inverter apparatus for producing each level of the 3-level output. When only the self-arc-suppressing type semiconductor devices 1a and 1b are lit on, the positive electrode P of the D.C. power supply and the output terminal A are electrically connected to each other, so that a voltage equal to the full level 2E of the D.C. power supply is obtained at the output terminal A. When only the self-arc-suppressing semiconductor devices 1b and 1c on both sides of the output terminal A are turned on, the neutral potential point B of the D.C. power supply 3 is electrically connected to the output terminal A, so that an intermediate voltage E which is half the full level 2E of the D.C. power supply, is obtained from the output terminal A. When only the self-arc-suppressing type semiconductor devices 1c and 1d of the negative arm are turned on, the negative electrode N of the D.C. power supply 3 and the output terminal A are electrically connected to each other so that zero volt is obtained as the output from the output terminal A.

A GTO thyristor (referred to as GTO, hereafter) can be used as the self-arc-suppressing semiconductor device in the 3-level inverter apparatus of FIG. 19, although such a type of semiconductor device has restriction in voltages and current increase rates. When such a semiconductor device is used, it is necessary to employ a snubber circuit as shown in FIG. 20. More specifically, in FIG. 20, numeral 6 denotes a snubber circuit which is connected in series to the GTO 1 and, hence, called as a series snubber circuit. This series snubber circuit is composed of an anode reactor 7, a diode 8 and a resistor 9. Numeral 10 denotes a snubber circuit which is connected in parallel with the GTO 1 and, hence, is referred to as a parallel snubber circuit. This basic arrangement is disclosed in APPLICATION OF GTO TO VEHICLE PROPULSION CONTROL SYSTEM, Technical Report of Mitsubishi Denki Giho, Vol. 58, No. 12, 1984. In operation, the snubber circuit functions such that, when the GTO 1 is in on state, the anode reactor 7 suppresses the rate of rise of current in the GTO 1 to a desired level while storing energy, whereas, when the GTO 1 has been turned off, a snubber capacitor 11 suppresses the rate of rise of the voltage applied to the GTO 1 to a predetermined value while storing energy. Thus, the snubber circuit functions as a protective circuit which protects GTO 1 from breakdown during switching of the GTO 1. In this snubber circuit, the energy stored in the anode reactor 7 and the energy stored in the snubber capacitor 11 are consumed by resistors 9 and 13, respectively, each time the GTO 1 is switched over.

FIG. 21 shows a 3-level inverter apparatus in which, by way of example, GTOs 1a, 1b, 1c and 1d are used as self-arc-suppressing type semiconductor devices 1a, 1b, 1c and 1d and a parallel snubber circuit of the same type as that denoted by 10 in FIG. 20 is connected in parallel with each GTO. In the circuit shown in FIG. 21, the capacitors 4a, 4b shown in FIG. 17 are substituted by D.C. power supplies 3a and 3b as equivalent components. It is assumed that each of the D.C. power supplies 3a, 3b as the potential-divided source provides a voltage E. From a theoretical point of view, it is possible to suppress the rate of rise of the current in each of the GTOs 1a, 1b, 1c and 1d of the respective phases, by inserting a pair of anode reactors 7a and 7b shown in FIG. 21. In the arrangement shown in FIG. 21, an additional anode reactor 7c is inserted in a line leading from the intermediate potential point B, so that energy stored in all anode reactors 7a, 7b and 7c are temporarily absorbed by voltage clamp circuits 14a, 14b and then charged through and consumed by resistors 17a, 17b. Thus, the GTOs 1a, 1b, 1c and 1d which constitute the 3-level inverter apparatus are switched for producing three output levels as stated before. Energy stored in the reactors and energy stored in the capacitors are consumed by the resistors each time such a switching is performed.

A description will now be given of the operation of the circuit of FIG. 21. Paths or lines mentioned in the following description are collectively shown in FIG. 22. The 3-level inverter apparatus of FIG. 21 has a positive arm constituted by GTOs 1a and 1b and free wheel diodes 2a and 2b, and a negative arm constituted by GTOs 1c and 1d and free wheel diodes 2c and 2d. Numerals 5a and 5b denote clamp diodes. Clamp circuits 14a, 14b are preferably constituted by capacitors 15a, 15b of large capacitance values, diodes 16a, 16b and resistors 17a, 17b. The GTO 1a has a parallel snubber circuit which is composed of a snubber capacitor 11a, a snubber diode 12a and a resistor 13a. Other GTOs 1b, 1c and 1d also are provided with their own snubber circuits. Numerals 7a, 7b and 7c show anode reactors which function as a snubber circuit. Although not shown, an inductive load is connected to 3-level inverter apparatus. It is assumed that the vector of the load current does not change during switching of each GTO 1a, 1b, 1c or 1d.

A description will now be given of the turn-off operation of the GTO 1a. The GTOs 1a and 1b of the positive arm are on, while the GTOs 1c and 1d of the negative arm are off. It is assumed that a load current is flowing from the output terminal A in the direction of an arrow through a line 1 shown in FIG. 22, so that voltage across the snubber capacitor 11a and the voltage across the snubber capacitor 11b are zero, while the voltage across the snubber capacitor 11c and the voltage across the snubber capacitor 11d have been charged up to the divided potentials, i.e., up to the voltage E of the divisions 3a and 3b of the power supply. The following operation is performed when the GTO 1a is turned off from this state to interrupt the load current, followed by turning on of the GTO 1c after elapse of a predetermined short-circuit time. When GTO 1a is turned off, the interrupted current is bypassed to a line 2 so as to charge up the snubber capacitor 11a. When the voltage across the snubber capacitor 11a rises to exceed the voltage E of the D.C. power supply 3, the clamp diode 5a is turned on to become conductive so as to pass the load current via a line 3. In this process, the current from the anode reactor 7a is made to flow through a line 4 so that the energy absorbed in the anode reactor 7a is absorbed by the capacitor 15a. The energy stored in the snubber capacitors 11c, 11d is discharged to the load side through a line 5 via resistors 13c, 13d so as to be consumed by the latter. When the GTO 1c is turned on after elapse of a predetermined time from the turning off of the GTO 1a, energy still remains in the snubber capacitors 11c and 11d, but the energy remaining in the snubber capacitor 11c is completely consumed through the resistor 13c via a line 6, while the snubber capacitor 11d is charged up to the level E of the division of the D.C. power supply. As a consequence, the load current is made to flow through the line 3, so that the energy which has been temporarily stored in the overcharge voltage in the capacitor 15a is discharged through a resistor 17a.

The following operation is performed when the GTO 1b is turned off. It is assumed that the GTOs 1a and 1b of the positive arm are off and on, respectively, while the GTOs 1c and 1d of time negative arm are on and off, respectively, so that a load current flows in the direction of the arrow in the output terminal A past the line 3, and the voltages across the snubber capacitors 11b, 11c are respectively zero, while the snubber capacitors 11a, 11d have been charged up to the level E of the divisions 3a, 3b of the D.C. power supply. It is also assumed that, in the state of the inverter apparatus stated above, the GTO 1b is turned off and, after elapse of a predetermined time thereafter, the GTO 1d is turned on. The current interrupted as a result of turning off of the GTO 1b is made to bypass through a line 7 so as to charge up a snubber capacitor 11b and, when the voltage charged in the capacitor 11b is increase to exceed the level E of the divided source voltage supplied by the D.C. power supply 3b, the free-wheel diodes 2c and 2d are turned on so that the load current flows through the line 8. In this process, the electrical current from the anode reactor 7c is made to flow through a line 9, so that the energy stored in the anode reactor 7c is absorbed by the capacitor 15b. Meanwhile, the energy stored in the snubber capacitor 11d is discharged to the load side through a line 10 via a resistor 13d so as to be consumed by the latter. When the GTO 1d is turned on after elapse of a predetermined time from the turning off of the GTO 1b, if there is any residual energy in the snubber capacitor 11d, such energy is completely consumed by the resistor 13d through a line 11. Consequently, the load current is made to flow through the line 8. In addition, the energy which has over-charged the capacitor 15b is discharged through and consumed by a resistor 17b.

When the GTO 1d is turned off in this state followed by turning on of the GTO 1b after elapse of a time therefrom, the load current starts to be supplied via the line 3, and the energy stored in the snubber capacitor 11b is discharged through a line 12 while being consumed by the resistor 13b until the voltage across this capacitor becomes zero. Meanwhile, the snubber capacitor 11d is charged up to the voltage E of the division 3b of the D.C. power supply through a line 13, and the energy which has been excessively stored in the anode reactors 7b, 7c is absorbed by the capacitor 15b through a line 14. Consequently, the load current is made to flow through the line 3. As a result, the energy which has been temporarily stored in the capacitor 15b as overcharge voltage is discharged through the resistor 17b.

When the GTO 1c is turned on in this state followed by turning on of the GTO 1a after elapse of a predetermined time therefrom, the load current starts to be supplied via the line 1 and the energy stored in the snubber capacitor 11a is discharged through a line 15 while being consumed by the resistor 13a until the voltage across this capacitor becomes zero. Meanwhile, the snubber capacitor 11c is charged up to the voltage E of the division 3a of the D.C. power supply through a line 16, and the energy which has been excessively stored in the anode reactors 7a, 7c is absorbed by the capacitor 15a through a line 17. Consequently, the load current is made to flow through the line 2. As a result, the energy which has been temporarily stored in the capacitor 15a as over-charge voltage is discharged through the resistor 17a.

The switching operations as performed by the GTOs 1a, 1b, 1c and 1d when load current is flowing in the direction reverse to that of arrow in the Figure are not described because they are completely symmetrical to those performed by these GTOs when the current is flowing in the direction of the arrow.

In the known 3-level inverter apparatuses having the described constructions, resistors occupy considerably large part of the components, and the energy stored in capacitors and reactors which are energy accumulating elements of the series and parallel snubber circuits is consumed by these resistors each time the self-arc-suppressing semiconductor element, e.g., GTO, is turned on and off. This undesirably reduces the efficiency of the inverter apparatus, making it difficult to obtain 3-level inverter apparatus operable at higher frequencies, while increasing demand for greater capacity of cooling devices in the inverter apparatus, resulting in an increase in the size of the 3-level inverter itself.

SUMMARY OF THE INVENTION

Accordingly, an object of the present invention is to provide an inverter apparatus in which the number of the resistors is minimized to realize a compact construction while attaining higher efficiency, as well as operability at higher frequencies, thus overcoming the above-described problems of the known arts.

To this end, according to the invention, there is provided an inverter apparatus, comprising: first and second self-arc-suppressing semiconductor devices connected in series between a positive electrode of a D.C. power supply having a mid-potential point and an output terminal; a first reactor connected between the first and second semiconductor devices and forming, in cooperation with the first and second semiconductor devices, a positive arm; third and fourth self-arc-suppressing semiconductor devices connected in series between a negative electrode of the D.C. power supply and the output terminal; a second reactor connected between the third and fourth semiconductor devices and forming, in cooperation with the third and fourth semiconductor devices, a negative arm; a first diode connected between one end of the first reactor and the mid-potential point of the D.C. power supply in forward direction with respect to the output terminal; a second diode connected between one end of the second reactor and the mid-potential point of the D.C. power supply in backward direction with respect to the output terminal; first to fourth series connections each including a diode and a capacitor connected in series to each other, the first to fourth series connections being connected in parallel with the first to fourth semiconductor devices, respectively; a first discharge resistor connected between the point where the diode and the capacitor of the first series connection are connected to each other and the point where the diode and the capacitor of the third series connection are connected to each other; and a second discharge resistor connected between the point where the diode and the capacitor of the second series connection are connected to each other and the point where the diode and the capacitor of the fourth series connection are connected to each other.

BRIEF DESCRIPTION OF THE DRAWINGS

FIG. 2 is an illustration of paths of electrical currents in various modes of operation of the first embodiment;

FIG. 4 is an illustration of paths of electrical currents in various modes of operation of the second embodiment;

FIG. 8 is an illustration of paths of electrical currents in various modes of operation of the fourth embodiment;

FIG. 22 is an illustration of paths of electrical currents in each step of operation of the circuit shown in FIG. 21.

DESCRIPTION OF THE PREFERRED EMBODIMENTS

Figure 1:
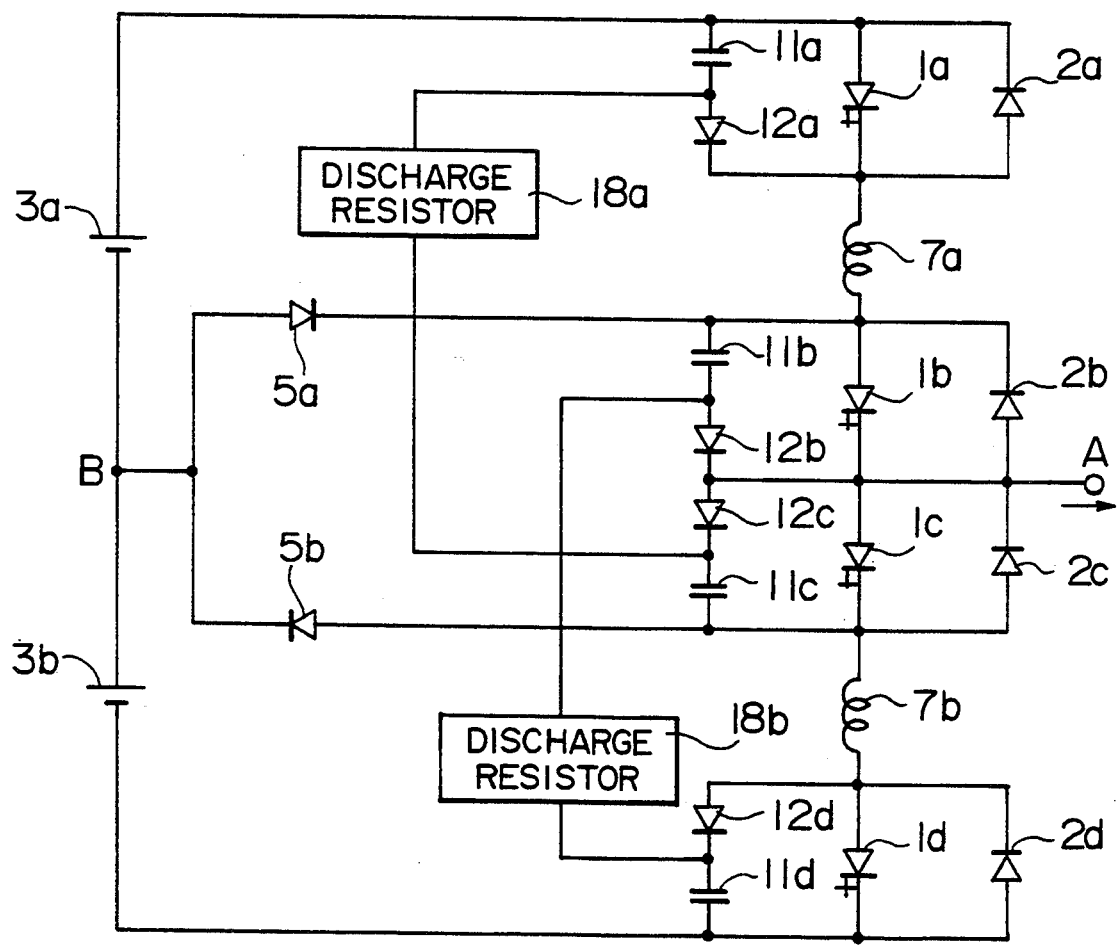
FIG. 1 is a circuit diagram showing the construction of a first embodiment of a 3-level inverter apparatus of the present invention.
Figure 17:
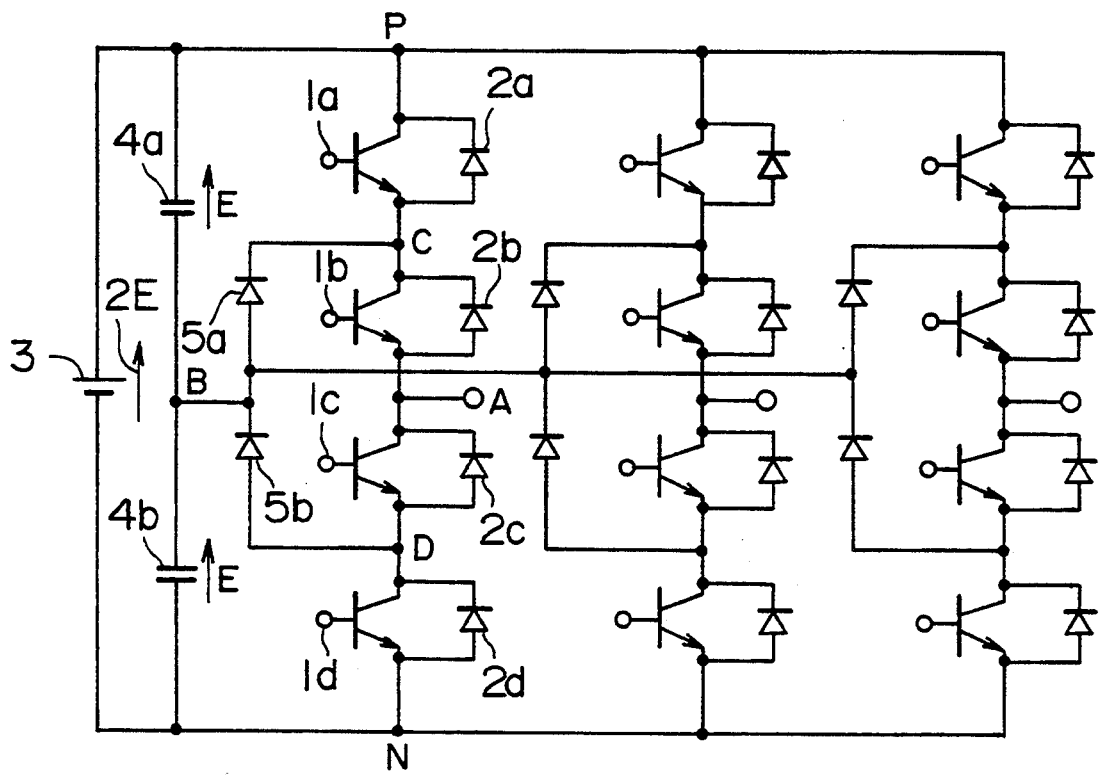
FIG. 17 is a circuit diagram showing the construction of a known 3-level inverter apparatus.
Figure 18:
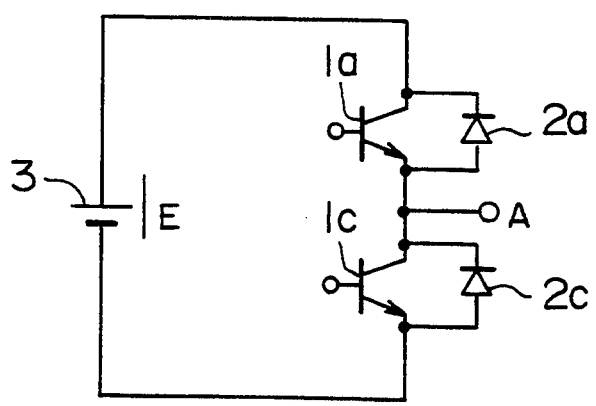
FIG. 18 is a circuit diagram showing the construction of a known 2-level inverter apparatus.
Figure 19:
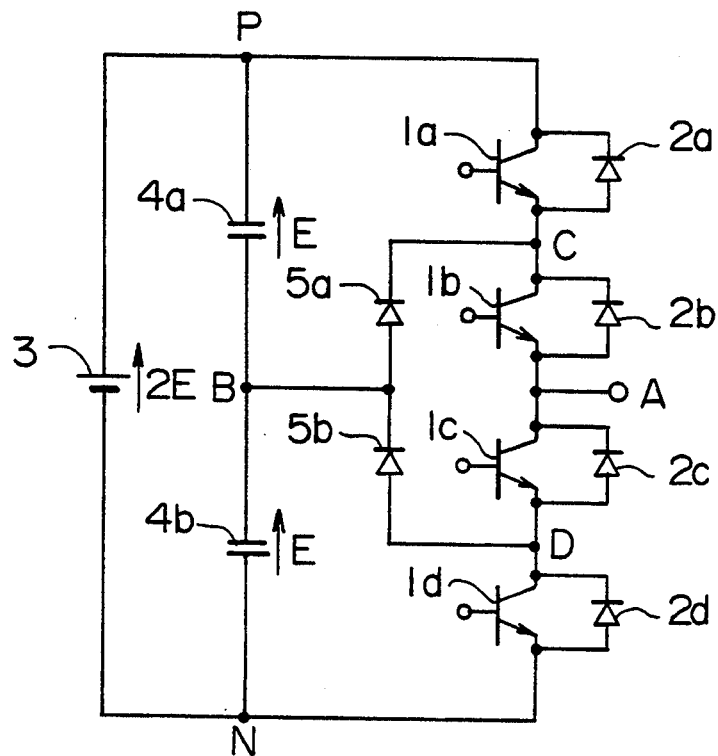
FIG. 19 is a circuit diagram showing the construction of another known 3-level inverter apparatus.
Figure 20:
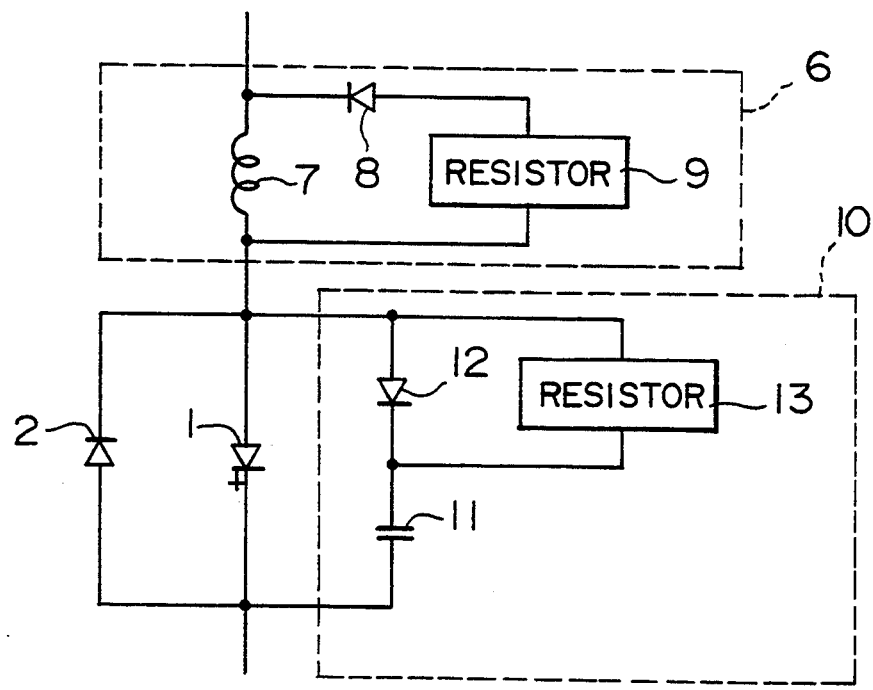
FIG. 20 is an illustration of snubber circuits.
Figure 21:
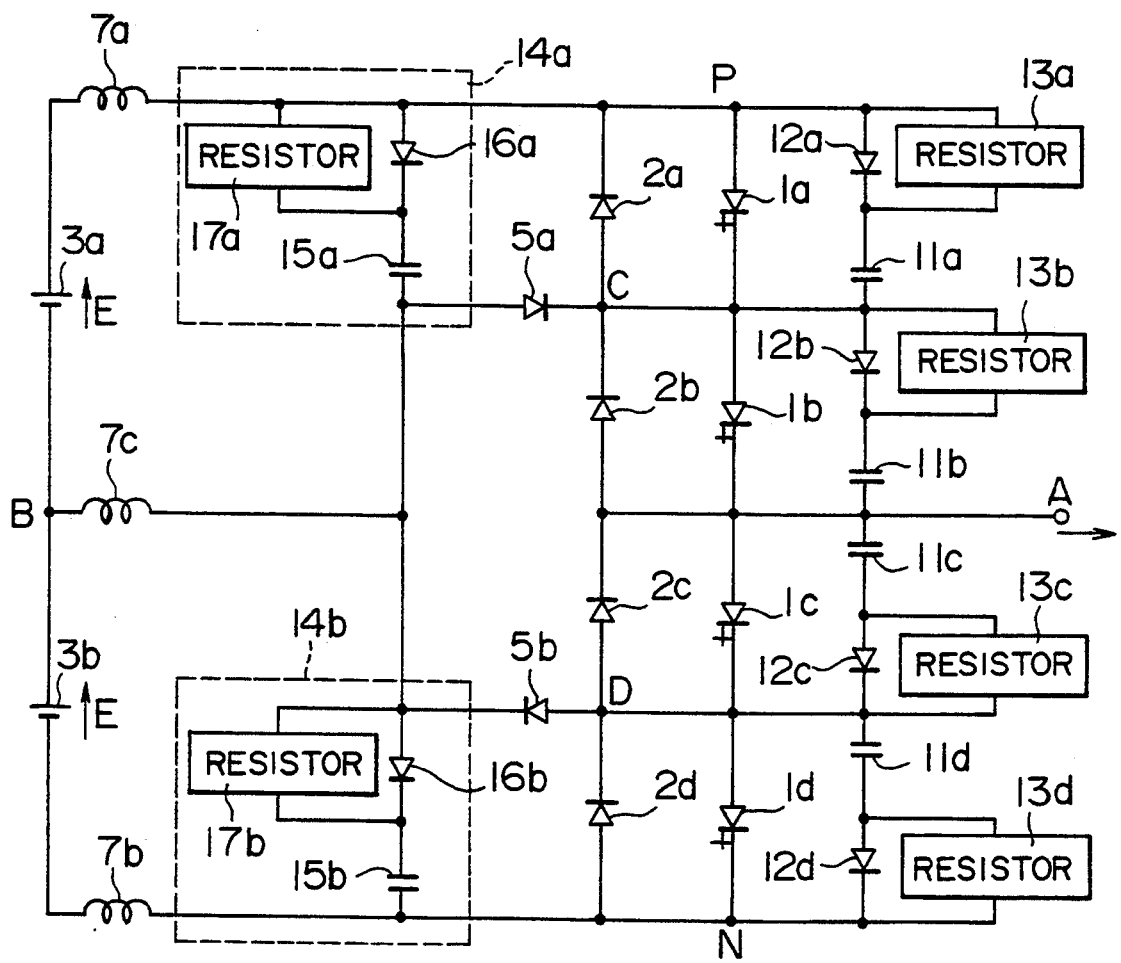
FIG. 21 is a circuit diagram showing the construction of a known 3-level inverter apparatus having snubber circuits.

In the 3-level inverter apparatus of the first embodiment shown in FIG. 1, thyristors (GTOs) $1a$, $1b$, $1c$ and $1d$ are used, by way of example, as the self-arc-suppressing devices $1a$, $1b$, $1c$ and $1d$. It is assumed that these GTOs can be treated as ideal switches which do not need any short-circuit prevention time. In FIG. 1, the same reference numerals are used to denote parts or components which are the same as those appearing in FIGS. 17 and 21.

In this embodiment, a positive arm has a GTO $1a$ as a first self-arc-suppressing semiconductor device, a GTO $1b$ as a second self-arc-suppressing semiconductor device, free-wheel diodes $2a$, $2b$ and an anode reactor $7a$. Similarly, a negative arm is composed of a GTO $1c$ as a third self-arc-suppressing semiconductor device, a GTO $1d$ as a fourth self-arc-suppressing semiconductor device, free-wheel diodes $2c$, $2d$ and an anode reactor $7b$. Numerals $5a$ and $5b$ denote clamp diodes which are connected, respectively, between the mid-potential point B and the anode of the GTO $1b$ and between the cathode of the GTO $1c$ and the mid-potential point. The GTO $1a$ is provided with a series connection which functions as a parallel snubber circuit and which has a snubber capacitor $11a$ and a snubber diode $12a$. Other GTOs $1b$, $1c$ and $1d$ have similar series connections. The anode reactors $7a$, $7b$ function as series snubber circuits and are respectively connected between the GTO $1a$ and the GTO $1b$ and between the GTO $1c$ and the GTO $1c$. Discharge resistors $18a$, $18b$ are respectively common to the snubber capacitors $11a$, $11c$ and the snubber capacitors $11b$, $11d$. More specifically, the discharge resistor $18a$ is connected between the point of connection between the snubber capacitor $11a$ and the snubber diode $12a$ and the point of connection between the snubber capacitor $1c$ and the snubber diode $12c$. The discharge resistor $18b$ is connected between the point of connection between the snubber capacitor $11b$ and the snubber diode $12b$ and the point of connection between the snubber capacitor $11d$ and the snubber diode $12d$. In FIG. 1, the capacitors $4a$, $4b$ of FIG. 17 have been substituted by equivalent two D.C. power supplied $3a$, $3b$. Each of the divisions $3a$, $3b$ of the D.C. power supply provides a voltage E. It is also assumed that an inductive load which is not shown is connected to the 3-level inverter apparatus, and that the vector of the load current is not changed during switching of each GTO $1a$, $1b$, $1c$ and $1d$.

The operation of this 3-level inverter apparatus will be described with reference to FIG. 1. Paths or lines of currents are collectively shown in FIG. 2. The operation caused by turning off of the GTO 1a is as follows. It is assumed here that the GTOs 1a and 1b of the positive arm are on, while the GTOs 1c and 1d of the negative arm are off and that load current is flowing in the direction of the arrow from the output terminal A along the path 21, so that the voltages across the snubber capacitors 11a, 11b are both zero volt while the snubber capacitors 11c and 11d have been charged up to the same level as the voltage E of the divisions 3a, 3b of the D.C. power supply. In this state, when the GTO 1a is turned off to interrupt the load current followed by turning on of the GTO 1c immediately thereafter, the current interrupted as a result of turning off of the GTO 1a is made to by-pass to a line 22 so as to charge up the snubber capacitor 11a so as to suppress rise of the voltage applied to the GTO 1a. When the snubber capacitor 11a has been charged up to the same level as the voltage E of the division 3a of the D.C. power supply, the clamp diode 5a becomes conductive so that the lead current is allowed to flow through a line 23. Meanwhile, the energy stored in the snubber capacitor 11c is discharged through a line 24 via the discharge resistor 18a until the voltage across the capacitor 11c is reduced to zero volt. At the moment immediately after the discharge from the snubber capacitor 11c, energy has been excessively stored in the anode reactor 7a, but this energy is completely consumed by the discharge resistor 18a through the line 25. After completion of the described operation, the lead current flows through the line 23.

The operation caused by turning off of the GTO 1b is as follows. It is assumed here that the GTOs 1a and 1b of the positive arm are off and on, respectively, while the GTOs 1c and 1d of the negative arm are on and off, respectively, and that lead current is flowing in the direction of the arrow from the output terminal A along the path 23, so that the voltages across the snubber capacitors 11b, 11c are both zero vomit while the snubber capacitors 11a and 11d have been charged up to the same level as the voltage E of the divisions 3a, 3b of the D.C. power supply. In this state, when the GTO 1b is turned off to interrupt the load current followed by turning on of the GTO 1d immediately thereafter, the current interrupted as a result of turning off of the GTO 1b is made to by-pass to a line 26 so as to charge up the snubber capacitor 11b so as to suppress rise of the voltage applied to the GTO 1b. When the snubber capacitor 11b has been charged up to the same level as the voltage E of the division 3b of the D.C. power supply, the freewheel diodes 2c, 2d become conductive so that the load current is allowed to flow through a line 27. Meanwhile, the energy stored in the snubber capacitor 11d is discharged through a line 28 via the discharge resistor 18b until the voltage across the capacitor 11d is reduced to zero volt. At the moment immediately after the discharge from the snubber capacitor 11c, energy has been excessively stored in the anode reactor 7b, but this energy is completely consumed by the discharge resistor 18b through the line 29. After completion of the described operation, the load current flows through the line 27.

The operation caused by turning on of the GTO 1b is as follows. It is assumed here that the GTOs 1a and 1b of the positive arm are off, while the GTOs 1c and 1d of the negative arm are on, and that load current is flowing in the direction of the arrow from the output terminal A along the path 27, so that the voltages across the snubber capacitors 11c, 11d are both zero volt while the snubber capacitors 11a and 11b have been charged up to the same level as the voltage E of the divisions 3a, 3b of the D.C. power supply. In this state, when the GTO 1b is turned on immediately after turning Off of the GTO 1d, the load current starts to be supplied through the line 23 while the rate of rise of the current in the GTO 1b is suppressed by the anode reactor 7b, so that the energy stored in the snubber capacitor 11d is discharged through a line 30 via the discharge resistor 18b so as to be consumed by the latter until the voltage across the capacitor 11b is reduced to zero volt. Meanwhile, the snubber capacitor 11d is charged up to the level E of the division of the D.C. power supply 3b via line 31, so that the energy excessively charged in the anode reactor 7b is discharged through a line 29 so as to be completely consumed by the discharge resistor 18b. After completion of this operation, the load current flows through the line 23.

The operation caused by turning on of the GTO 1a is as follows. It is assumed here that the GTOs 1a and 1b of the positive arm are off and on, respectively, while the GTOs 1c and 1d of the negative arm are on and off, respectively, and that load current is flowing in the direction of the arrow from the output terminal A along the path 23, so that the voltages across the snubber capacitors 11b, 11c are both zero volt while the snubber capacitors 11a and 11d have been charged up to the same level as the voltage E of the divisions 3a, 3b of the D.C. power supply. In this state, when the GTO 1a is turned on immediately after turning off of the GTO 1c, the load current starts to be supplied through the line 21 while the rate of rise of the current in the GTO 1b is suppressed by the anode reactor 7b, and the energy stored in the snubber capacitor 11a is discharged through a line 32 via the discharge resistor 18a so as to be consumed by the latter until the voltage across the capacitor 11a is reduced to zero volt. Meanwhile, the snubber capacitor 11c is charged up to the level E of the division of the D.C. power supply 3a via line 33, so that the energy excessively charged in the anode reactor 7b is discharged through a line 25 so as to be completely consumed by the discharge resistor 18a. After completion of this operation, the load current flows through the line 21.

When the load current is flowing in the direction reverse to that of the arrow in this Figure, the operations caused by switching of the GTOs 1a, 1b, 1c and 1d are exactly symmetrical with those described above. Detailed description is therefore omitted in regard to the operations performed when the load current is flowing in the direction reverse to the direction of the arrow.

A description will now be given of a second embodiment of the present invention.

Figure 3:
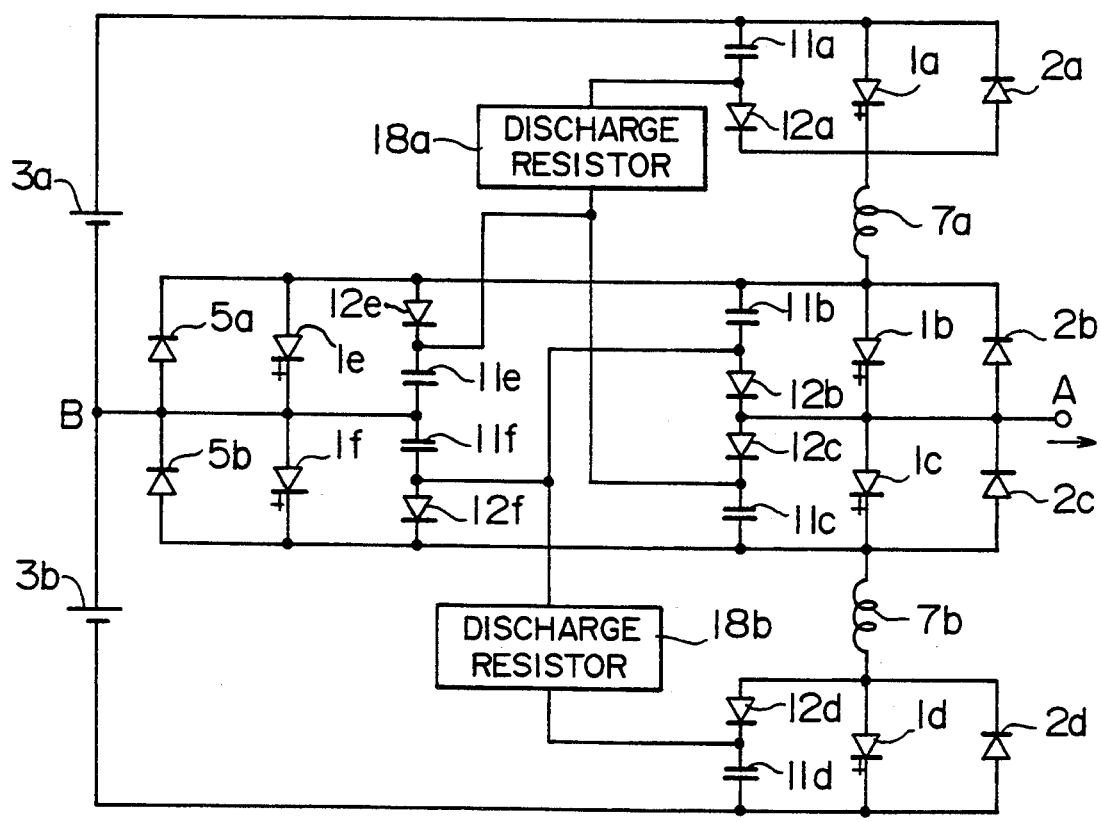
FIG. 3 is a circuit diagram showing the construction of a second embodiment of the 3-level inverter apparatus of the present invention.

In the 3-level inverter apparatus of the second embodiment shown in FIG. 3, thyristors (GTOs) 1a, 1b, 1c and 1d are used, by way of example, as the self-arc-suppressing devices 1a, 1b, 1c and 1d.

The construction of the 3-level inverter apparatus of this embodiment partly overlap that of the first embodiment, so that the description will be made only in regard to the portions of the construction which are different from those in the first embodiment. In this embodiment, the clamp diode 5a has an auxiliary GTO 1e and is provided with a series connection which is composed of a snubber capacitor 11e and a snubber diode 12e and which functions as a parallel snubber circuit.

Similar arrangement is provided for the clamp diode 5b. Discharge resistors 18a, 18b are respectively common to the snubber capacitors 11a, 11c, 11e and the snubber capacitors 11b, 11d, 11f. In this embodiment also, it is assumed that an inductive load which is not shown is connected to the 3-level inverter apparatus, and that the vector of the load current is not changed during switching of each GTO 1a, 1b, 1c and 1d.

The operation of this 3-level inverter apparatus will be described. Paths or lines of currents are collectively shown in FIG. 4. The operation caused by turning off of the GTO 1a is as follows. It is assumed here that the GTOs 1a and 1b of the positive arm are on, while the GTOs 1c and 1d of the negative arm, as well as auxiliary GTOs 1e and 1f, are off and that load current is flowing in the direction of the arrow from the output terminal A along a path 41, so that the voltages across the snubber capacitors 11a, 11b, 11f are all zero volt while the snubber capacitors 11c, 11d, 11e have been charged up to the same level as the voltage E of the divisions 3a, 3b of the D.C. power supply. In this state, when the GTO 1a is turned off to interrupt the load current and, simultaneously, the auxiliary GTO if is turned on followed by turning on of the GTO 1c and simultaneous turning off of the auxiliary GTO if after elapse of a predetermined short-circuit prevention time, the current interrupted as a result of turning off of the GTO 1a is made to by-pass to a line 42 so as to charge up the snubber capacitor 11a thereby to suppress the rate of rise of the voltage applied to the GTO 1a. Meanwhile, the load current is shared by the charging current for charging the snubber capacitor 11a and discharge currents from snubber capacitors 11c and 11e which flow through the lines 43 and 44. As a consequence, the charges which have been stored in the snubber capacitors 11c and 11e are discharged to the load side. Strictly speaking, as a consequence, the rate of rise of the voltage applied to the GTO 1a is suppressed by a composite electrostatic capacitance of the snubber capacitors 11a, 11c and 11e. When the GTO 1c is turned on with simultaneous turning off of the auxiliary GTO if after elapse of the short-circuit prevention time from turning off of the GTO 1a, if there is any energy remaining in the snubber capacitors 11c, 11e, the energy in the snubber capacitor 11c and the energy in the snubber capacitor 11e are discharged through lines 45 and 46, respectively, so as to be completely consumed by the discharge resistor 18a, until the voltage across these capacitors are reduced to zero. The snubber capacitor 11a is charged to the level E of the voltage of the division 3a of the D.C. power supply. At the moment immediately after this operation, energy has been excessively stored in the anode reactor 7a but such excessive energy is completely consumed through the discharge resistor 18a, via line 47. The clamp diode 5a becomes conductive when the snubber capacitor 11a has been charged up to the voltage E. After completion of the described operation, the load current flows through a line 48. Throughout the period of the above-described operation, the snubber capacitors 11a, 11c and 11e exhibit the same rates of rise and fall of the voltage.

The operation caused by turning off of the GTO 1b is as follows. It is assumed here that the GTOs 1a and 1b of the positive arm are off and on, respectively, while the GTOs 1c and 1d of the negative arm are on and off, respectively, with the auxiliary GTOs 1e and 1f being off, and that load current is flowing in the direction of the arrow from the output terminal A along a path 48, so that the voltages across the snubber capacitors 11b, 11c, 11e, 11f are all zero volt while the snubber capacitors 11a and 11d have been charged up to the same level as the voltage E of the divisions 3a, 3b of the D.C. power supply. In this state, when the GTO 1b is turned off to interrupt the load current followed by turning on of the GTO 1d after elapse of a predetermined short-circuit prevention time, the current interrupted as a result of turning off of the GTO 1b is made to by-pass to a line 49 so as to charge up the snubber capacitor 11b thereby to suppress the rate of rise of the voltage applied to the GTO 1b. Meanwhile, the load current is shared by the charging current for charging the snubber capacitor 11b, and discharge current from snubber capacitors 11d and the charging current to the snubber capacitor 11f which respectively flow through lines 50 and 51. As a consequence, the charges which have been stored in the snubber capacitors 11d are discharged to the load side. Strictly speaking, as a consequence, the rate of rise of the voltage applied to the GTO 1b is suppressed by a composite electrostatic capacitance of the snubber capacitors 11b, 11d and 11f. When the GTO 1d is turned on after elapse of a predetermined time from turning off of the GTO 1b, if there is any energy remaining in the snubber capacitor 11d, the energy in the snubber capacitor 11d is discharged through a line 52, so as to be completely consumed by the discharge resistor 18b, until the voltage across this capacitor is reduced to zero. The snubber capacitors 11b and 11f are charged to the level E of the voltage of the division 3b of the D.C. power supply. At the moment immediately after this operation, energy has been excessively stored in the anode reactor 7b but such excessive energy is completely consumed through the discharge resistor 18b, via a line 53. The free-wheel diodes 2c, 2d become conductive when the snubber capacitor 11b has been charged up to the voltage E. After completion of the described operation, the load current flows through a line 54. Throughout the period of the above-described operation, the snubber capacitors 11b, 11d and 11f exhibit the same rates of rise and fall of the voltage.

The operation caused by turning on of the GTO 1b is as follows. It is assumed here that the GTOs 1a and 1b of the positive arm, as well as the auxiliary GTOs 1e and 1f, are off, while the GTOs 1c and 1d of the negative arm are on and that load current is flowing in the direction of the arrow from the output terminal A along a path 54, so that the voltages across the snubber capacitors 11c, 11d, 11e are all zero volt while the snubber capacitors 11a, 11b, 11f have been charged up to the same level as the voltage E of the divisions 3a, 3b of the D.C. power supply. It is assumed that, in this state, the GTO 1d is turned off with simultaneous turning on of the auxiliary GTO 1e, followed by turning off of the auxiliary GTO 1e and simultaneous turning on of the GTO 1b after elapse of a predetermined short-circuit prevention time. The turning off of the GTO 1d and simultaneous turning on of the auxiliary GTO 1e do not cause any change in the state of the circuit because the load current flows from the terminal A in the direction of the arrow through the line 54. The subsequent turning off of the auxiliary GTO 1e and the simultaneous turning on of the GTO 1b causes the voltage E of the division 3b of the D.C. power supply to be applied to the anode reactor 7b, so that the load current starts to be supplied through the line 48 while the rate of increase in the current through the GTO 1b is suppressed by the anode reactor 7b. The current supplied through the GTO 1b then increases beyond the load current. The excess current is shunt to lines 55, 56 and 57, so that the snubber capacitor 11d is charged to the level E of the voltage of the division 3b, while the snubber capacitor 11f discharges down to zero volt to the division 3b of the D.C. power supply, while the snubber capacitor 11b discharges down to zero volt to the division as the energy charged therein is consumed through the discharge resistor 18b via line 58. At the moment immediately after this operation, energy has been excessively stored in the anode reactor 7b but such excessive energy is completely consumed through the discharge resistor 18b, via line 53. The clamp diode 5a becomes conductive when the snubber capacitor 11a has been charged up to the voltage E. After completion of the described operation, the load current flows through the line 48. Throughout the period of the above-described operation, the snubber capacitors 11b, 11d and 11f exhibit the same rates of rise and fall of the voltage.

The operation caused by turning on of the GTO 1a is as follows. It is assumed here that the GTOs 1a and 1b of the positive arm, as well as the auxiliary GTOs 1e and 1f, are off, while the GTOs 1c and 1d of the negative arm are on and that load current is flowing in the direction of the arrow from the output terminal A along a path 48, so that the voltages across the snubber capacitors 11a, 11b, 11e, 11f are all zero volt while the snubber capacitors 11a 11d have been charged up to the same level as the voltage E of the divisions 3a, 3b of the D.C. power supply. It is assumed that, in this state, the GTO 1a is turned on after elapse of a predetermined time from turning off of the GTO 1c. The turning off of the GTO 1c does not cause any change in the state of the circuit because the load current flows from the terminal A in the direction of the arrow through the line 48. The turning on of the GTO 1a causes the voltage E of the division 3a of the D.C. power supply to be applied to the anode reactor 7a, so that the load current starts to be supplied through the line 41 while the rate of increase in the current through the GTO 1a is suppressed by the anode reactor 7a. The current supplied through the GTO 1a then increases beyond the load current. The excess current is shunt to lines 59, 60 and 61, so that the snubber capacitors 11c, 11e are charged to the level E of the voltage of the division 3a, while the snubber capacitor 11c discharges down to zero volt to the division as the energy charged therein is consumed through the discharge resistor 18a via line 62. At the moment immediately after this operation, energy has been excessively stored in the anode reactor 7a but such excessive energy is completely consumed through the discharge resistor 18a, via line 47. After completion of the described operation, the load current flows through the line 41. Throughout the period of the above-described operation, the snubber capacitors 11a, 11c and 11e exhibit the same rates of rise and fall of the voltage.

When the load current is flowing in the direction reverse to that of the arrow in this Figure, the operations caused by switching of the GTOs 1a, 1b, 1c and 1d are exactly symmetrical with those described above. Detailed description is therefore omitted in regard to the operations performed when the load current is flowing in the direction reverse to the direction of the arrow.

A description will now be given of a third embodiment of the present invention.

Figures 5, 6:
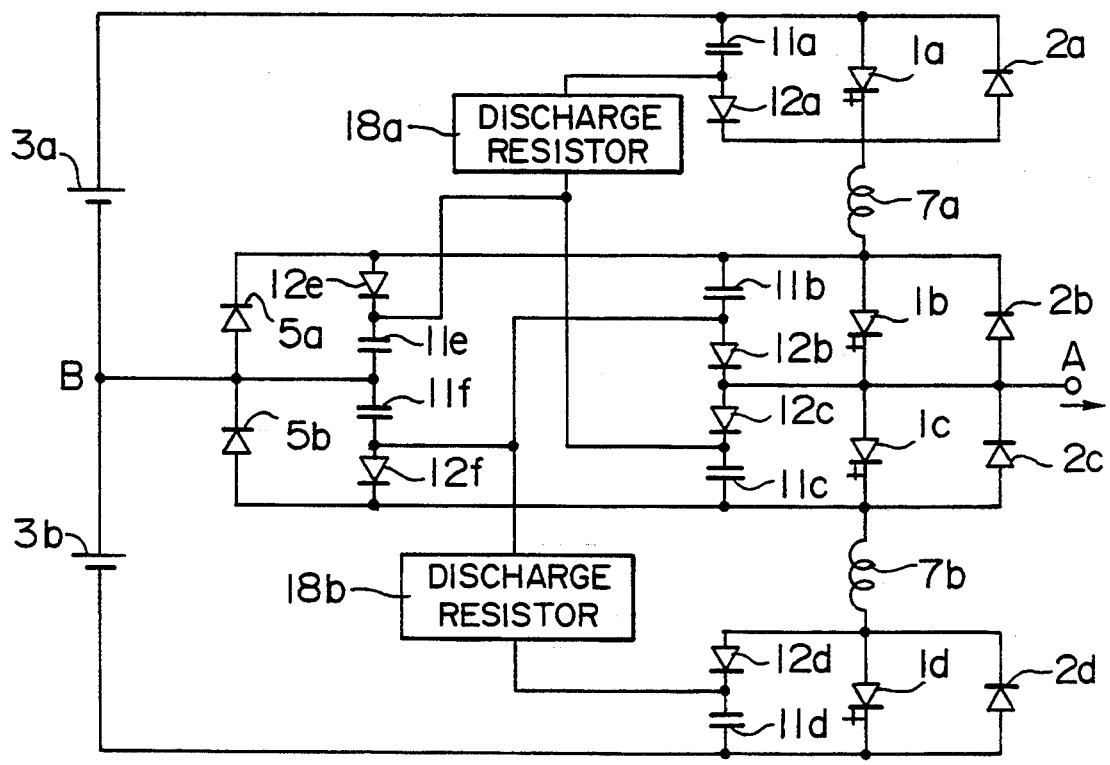
FIG. 5 is a circuit diagram showing the construction of a third embodiment of the 3-level inverter apparatus of the present invention.
FIG. 6 is an illustration of paths of electrical currents in various modes of operation of the third embodiment.

In the 3-level inverter apparatus of the third embodiment shown in FIG. 5, thyristors (GTOs) 1a, 1b, 1c and 1d are used, by way of example, as the self-arc-suppressing devices 1a, 1b, 1c and 1d.

The construction of the 3-level inverter apparatus of this embodiment partly overlap that of the second embodiment, so that the description will be made only in regard to the portions of the construction which are different from those in the second embodiment shown in FIG. 3. In this embodiment, the clamp diode 5a is provided only with a series connection which is composed of a snubber capacitor 11e and a snubber diode 12e and which functions as a parallel snubber circuit. Similar arrangement is provided for the clamp diode 5b. The operation of the circuit shown in FIG. 5 is different from the circuit of FIG. 3 only in the turn-off operation of the GTO 1a, so that the description of operation will be concentrated to the turn-off operation of the GTO 1a. In this embodiment also, it is assumed that an inductive load which is not shown is connected to the 3-level inverter apparatus, and that the vector of the load current is not changed during switching of each GTO 1a, 1b, 1c and 1d.

The operation of this 3-level inverter apparatus will be described with reference to FIG. 5. Paths or lines of currents are collectively shown in FIG. 6. The operation caused by turning off of the GTO 1a is as follows. It is assumed here that the GTOs 1a and 1b of the positive arm are on, while the GTOs 1c and 1d of the negative arm are off and that load current is flowing in the direction of the arrow from the output terminal A along a path 71, so that the voltages across the snubber capacitors 11a, 11b, 11f are all zero volt while the snubber capacitors 11c, 11d, 11e have been charged up to the same level as the voltage E of the divisions 3a, 3b of the D.C. power supply. In this state, when the GTO 1a is turned off to interrupt the load current followed by turning on of the GTO 1c after elapse of a predetermined short-circuit prevention time, the current interrupted as a result of turning off of the GTO 1a is made to by-pass to a line 72 so as to charge up the snubber capacitor 11a thereby to suppress the rate of rise of the voltage applied to the GTO 1a. Meanwhile, the load current is shared by the charging current for charging the snubber capacitor 11a and discharge currents from snubber capacitors 11c and 11e which flow through the lines 73 and 74. As a consequence, the charges which have been stored in the snubber capacitors 11c and 11e are discharged to the load side. Consequently, the snubber capacitor 11f is charged by the current discharged from the capacitor 11c. When the GTO 1c is turned on after elapse of the short-circuit prevention time from turning off of the GTO 1a, energy remains in the snubber capacitors 11c, 11f. However, the energy in the snubber capacitor 11c and the energy in the snubber capacitor 11f are discharged through lines 75 and 76, respectively, so as to be completely consumed by the discharge resistors 18a and 18b, respectively, until the voltage across these capacitors are reduced to zero. The snubber capacitor 11a is charged to the level E of the voltage of the division 3a of the D.C. power supply. At the moment immediately after this operation, energy has been excessively stored in the anode reactors 7a, 7b but such excessive energy is completely consumed through the discharge resistor 18a, 18b via lines 77, 78. The clamp diode 5a becomes conductive when the snubber capacitor 11a has been charged up to the voltage E. After completion of the described operation, the load current flows through a line 79. The operation of this circuit will be stabilized by provision of a diode in each discharge circuit so as to determine the direction of discharge from each snubber capacitor.

A description will now be given of a fourth embodiment of the present invention.

Figure 7:
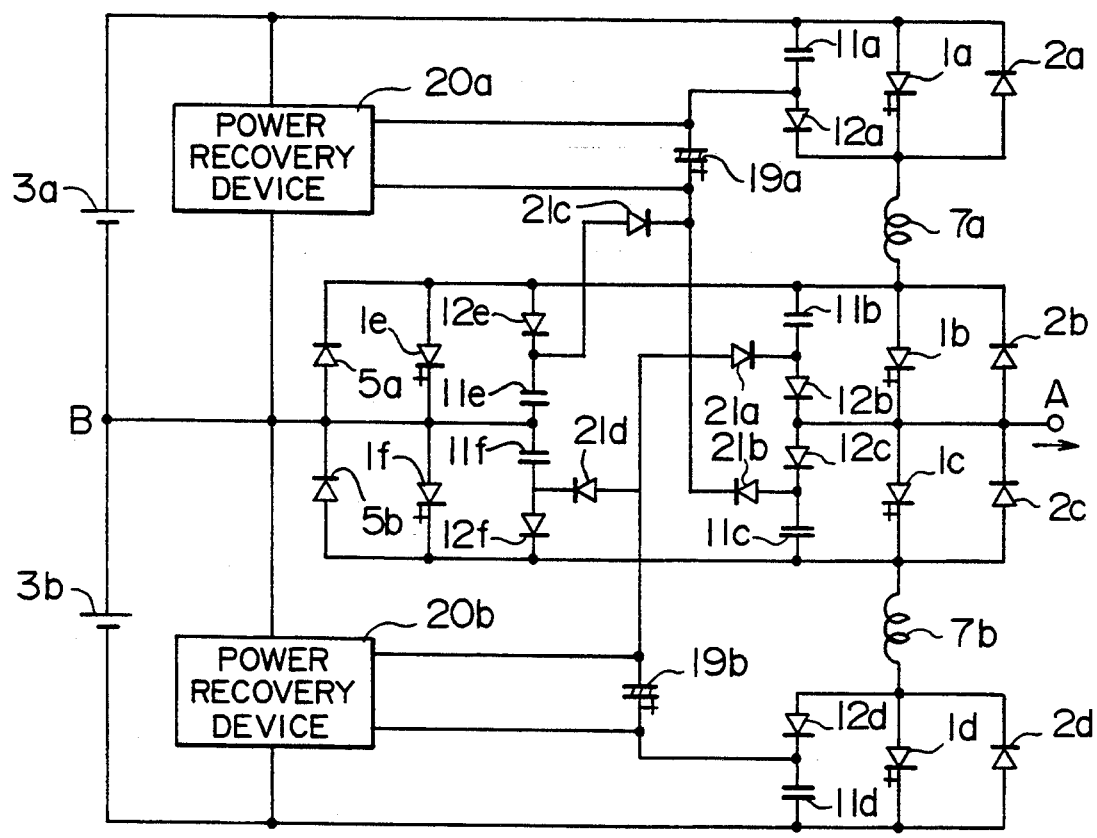
FIG. 7 is a circuit diagram showing the construction of a fourth embodiment of the 3-level inverter apparatus of the present invention.

In the 3-level inverter apparatus of the fourth embodiment shown in FIG. 7, thyristors (GTOs) 1a, 1b, 1c and 1d are used, by way of example, as the self-arc-suppressing devices 1a, 1b, 1c and 1d.

The construction of the 3-level inverter apparatus of this embodiment partly overlap that of the second embodiment shown in FIG. 3, so that the description will be made only in regard to the portions of the construction which are different from those in the second embodiment. Numerals 19a and 19b denote, respectively, recovery capacitors which are connected, respectively, in the discharge path common to the snubber capacitors 11a, 11c, 11e and the discharge path common to the snubber capacitors 11b, 11d, 11f. These recovery capacitors have definite charging polarity and preferably have large electrostatic capacitance. Numerals 20a, 20b denote power recovery devices which pickup energy from the recovery capacitors 19a, 19b so as to recover the energy to the divisions 3a, 3b of the D.C. power supply, thereby to control the charging voltage of the recovery capacitor 19a, 19b to a constant voltage level e. The voltage level e is a fraction of the voltage E of the divisions 3a, 3b of the D.C. power supply. In this embodiment also, it is assumed that an inductive load which is not shown is connected to the 3-level inverter apparatus as in the case of the embodiment shown in FIG. 1, and that the vector of the load current is not changed during switching of each GTO 1a, 1b, 1c and 1d. It is also assumed that the constant voltage e is maintained across each recovery capacitor 19a, 19b by the operation of the power recovery device 20a, 20b. Numerals 21a, 21b, 21c and 21d denote diodes for determining the direction of discharge from the respective snubber capacitors.

The operation of this 3-level inverter apparatus will be described with reference to FIG. 7. Paths or lines of currents are collectively shown in FIG. 8. The operation caused by turning off of the GTO 1a is as follows. It is assumed here that the GTOs 1a and 1b of the positive arm are on, while the GTOs 1c and 1d of the negative arm, as well as the auxiliary GTOs 1e, 1f are off and that load current is flowing in the direction of the arrow from the output terminal A along a path 81, so that the voltages across the snubber capacitors 11a, 11b, 11f are all zero volt while the snubber capacitors 11c, 11d, 11e have been charged up to the same level as the sum of the voltage E of the divisions 3a, 3b of the D.C. power supply and the voltage e of the recovery capacitors 19a, 19b. In this state, when the GTO 1a is turned off to interrupt the load current with simultaneous turning on of the auxiliary GTO 1f, followed by turning on of the GTO 1c with simultaneous turning off of the auxiliary GTO 1f after elapse of a predetermined short-circuit prevention time, the current interrupted as a result of turning off of the GTO 1a is made to by-pass to a line 82 so as to charge up the snubber capacitor 11a thereby to suppress the rate of rise of the voltage applied to the GTO 1a. Meanwhile, the load current is shared by the charging current for charging the snubber capacitor 11a and discharge currents from snubber capacitors 11c and 11e which flow through the lines 83 having the recovery capacitor 19a and the line 84. As a consequence, the charges which have been stored in the snubber capacitors 11c and 11e are discharged to the load side, while being recovered by the recovery capacitor 19a. In a strict sense, therefore, the rate of rise of the voltage applied to the GTO 1a is suppressed by the composite electrostatic capacitance formed by the snubber capacitors 11a, 11c, 11e. When the GTO 1c is turned on with simultaneous turning off of the auxiliary GTO 1f after elapse of the short-circuit prevention time from turning off of the GTO 1a, if energy remains in the snubber capacitors 11c, 11d. the energy in the snubber capacitor 11c and the energy in the snubber capacitor 11d are recovered by the recovery capacitor 19a through lines 85 and 86, respectively, until the voltage across these capacitors are reduced to zero. The snubber capacitor 11a is charged to the level which is the sum of the voltage E of the division 3a of the D.C. power supply and the voltage e of the recovery capacitor 19a. At the moment immediately after this operation, energy has been excessively stored in the anode reactors 7a but such excessive energy is completely recovered by the recovery capacitor 19a through the line 87. The clamp diode 5a becomes conductive when the snubber capacitor 11a has been charged up to the voltage E. After completion of the described operation, the load current flows through a line 88. Throughout the period of the described operation, the snubber capacitors 11a, 11c, 11e exhibit equal rates of rise and fall of voltage.

The operation caused by turning off of the GTO 1b is as follows. It is assumed here that the GTOs 1a and 1b of the positive arm are off and on, respectively, while the GTOs 1c and 1d of the negative arm are on and off, respectively, with the auxiliary GTOs 1e and 1f being off, and that load current is flowing in the direction of the arrow from the output terminal A along a path 88, so that the voltages across the snubber capacitors 11b, 11c, 11e, 11f are all zero volt while the snubber capacitors 11a and 11d have been charged up to the same level as the sum of the voltage E of the divisions 3a, 3b of the D.C. power supply and the voltage e of the recovery capacitors 19a, 19b. In this state, when the GTO 1b is turned off to interrupt the load current followed by turning on of the GTO 1d after elapse of a predetermined short-circuit prevention time, the current interrupted as a result of turning off of the GTO 1b is made to by-pass to a line 89 so as to charge up the snubber capacitor 11b thereby to suppress the rate of rise of the voltage applied to the GTO 1b. Meanwhile, the load current is shared by the charging current for charging the snubber capacitor 11b and discharge current from snubber capacitors 11d and the charging current to the snubber capacitor 11f which respectively flow through lines 90 having the recovery capacitor 19b and through the line 91. As a consequence, the charges which have been stored in the snubber capacitors 11d are discharged to the load side, while being recovered by the recovery capacitor 19b. Strictly speaking, as a consequence, the rate of rise of the voltage applied to the GTO 1b is suppressed by a composite electrostatic capacitance of the snubber capacitors 11b, 11d and 11f. When the GTO 1d is turned on after elapse of a predetermined time from turning off of the GTO 1b, if there is airy energy remaining in the snubber capacitor 11d, the energy in the snubber capacitor 11d is discharged through a line 92, so as to be completely recovered by the recovery capacitor 18b, until the voltage across this capacitor is reduced to zero. The snubber capacitors 11b and 1f are charged to the level which is the sum of the level E of the voltage of the division 3b of the D.C. power supply and the voltage e of the recovery capacitors 19a, 19b. At the moment immediately after this operation, energy has been excessively stored in the anode reactor 7b but such excessive energy is completely recovered by the recovery capacitor 19b, via a line 93. The free-wheel diodes 2c, 2d become conductive when the snubber capacitor 11b has been charged up to the voltage E. After completion of the described operation, the load current flows through a line 94. Throughout the period of the above-described operations, the snubber capacitors 11b, 11d and 11f exhibit the same rates of rise and fall of the voltage.

The operation caused by turning on of the GTO 1b is as follows. It is assumed here that the GTOs 1a and 1b of the positive arm, as well as the auxiliary GTOs 1e and 1f, are off, while the GTOs 1c and 1d of the negative arm are on and that load current is flowing in the direction of the arrow from the output terminal A along a path 94, so that the voltages across the snubber capacitors 11c, 11d, 11e are all zero volt while the snubber capacitors 11a, 11b, 11f have been charged up to the same level as the sum of the voltage E of the divisions 3a, 3b of the D.C. power supply and the voltage e of the recovery capacitors 19a, 19b. It is assumed that, in this state, the GTO 1d is turned off with simultaneous turning on of the auxiliary GTO 1e, followed by turning on of the auxiliary GTO 1e and simultaneous turning on of the GTO 1b after elapse of a predetermined short-circuit prevention time. The turning off of the GTO 1d and simultaneous turning on of the auxiliary GTO 1e do not cause any change in the state of the circuit because the load current flows from the terminal A in the direction of the arrow through the line 94. The subsequent turning off of the auxiliary GTO 1e and the simultaneous turning on of the GTO 1b cause the voltage E of the division 3b of the D.C. power supply to be applied to the anode reactor 7b, so that the load current starts to be supplied through the line 88 while the rate of increase in the current through the GTO 1b is suppressed by the anode reactor 7b. The current supplied through the GTO 1b then increases beyond the load current. The excess current is shunt to lines 95, 96 and 97, so that the snubber capacitor 11d is charged to a level which is the same as the sum of the level E of the voltage of the division 3b and the voltage e of the recovery capacitor 19b, while the snubber capacitor 11f discharges down to zero volt to the division 3b of the D.C. power supply while being recovered by the recovery capacitor 19b. At the same time, the energy in the snubber capacitor 11b is completely recovered by the recovery capacitor 19b via the line 98, until the voltage across the snubber capacitor 11b is reduced to zero. At the moment immediately after this operation, energy has been excessively stored in the anode reactor 7b but such excessive energy is completely recovered by the recovery capacitor 19b, via line 87. After completion of the described operation, the load current flows through the line 88. Throughout the period of the above-described operation, the snubber capacitors 11b, 11d and 11f exhibit the same rates of rise and fall of the voltage.

The operation caused by turning on of the GTO 1a is as follows. It is assumed here that the GTO 1a of the positive arm, the GTO 1d of the negative arm and the auxiliary GTOs 1e and 1f are off, while the GTO 1b of the positive arm and the GTO 1c of the negative arm are on, and that load current is flowing in the direction of the arrow from the output terminal A along a path 88, so that the voltages across the snubber capacitors 11b, 11c, 11e, 11f are all zero volt while the snubber capacitors 11a, 11d have been charged up to the same level as the sum of the voltage E of the divisions 3a, 3b of the D.C. power supply and the voltage e of the recovery capacitors 19a, 19b. It is assumed that, in this state, the GTO 1a is turned on after elapse of a predetermined time from turning off of the GTO 1c. The turning off of the GTO 1c does not cause any change in the state of the circuit because the load current flows from the terminal A in the direction of the arrow through the line 88. The turning on of the GTO 1a causes the voltage E of the division 3a of the D.C. power supply to be applied to the anode reactor 7a, so that the load current starts to be supplied through the line 81 while the rate of increase in the current through the GTO 1a is suppressed by the anode reactor 7a. The current supplied through the GTO 1a then increases beyond the load current. The excess current is shunt to lines 99, 100 and 101, so that the snubber capacitors 11c, 11e are charged to the level which is equal to the sum of the voltage E of the division 3a and the voltage e of the recovery capacitor 19a, while the snubber capacitor 11a discharges down to zero volt with its energy completely recovered by the recovery capacitor 19a, via a line 102. At the moment immediately after this operation, energy has been excessively stored in the anode reactor 7a but such excessive energy is completely recovered by the recovery capacitor 19a, via line 87. After completion of the described operation, the load current flows through the line 81. Throughout the period of the above-described operation, the snubber capacitors 11a, 11c and 11e exhibit the same rates of rise and fall of the voltage.

Figure 9:
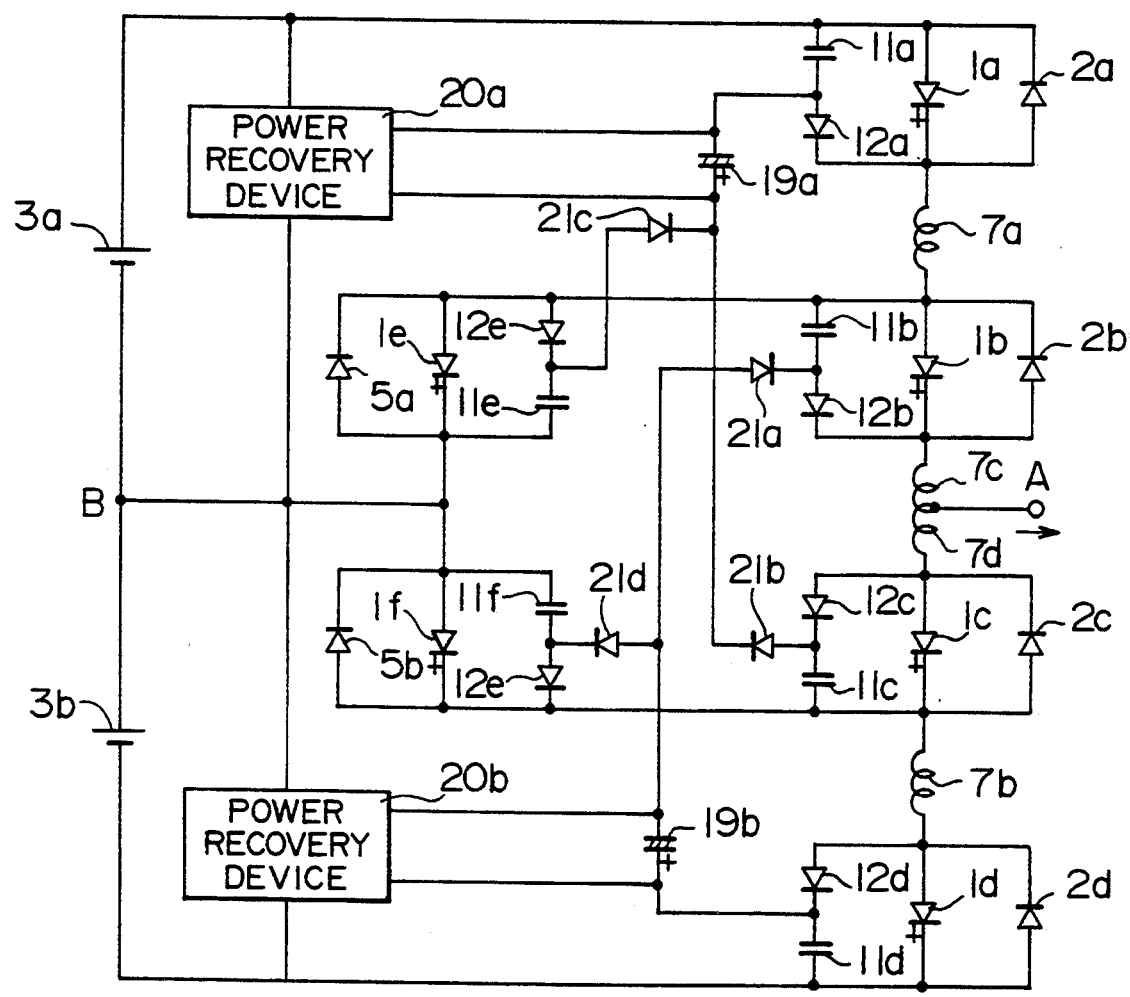
FIGS. 9 and 10 are circuit diagrams showing the constructions of modifications of the fourth embodiment.
Figure 10:
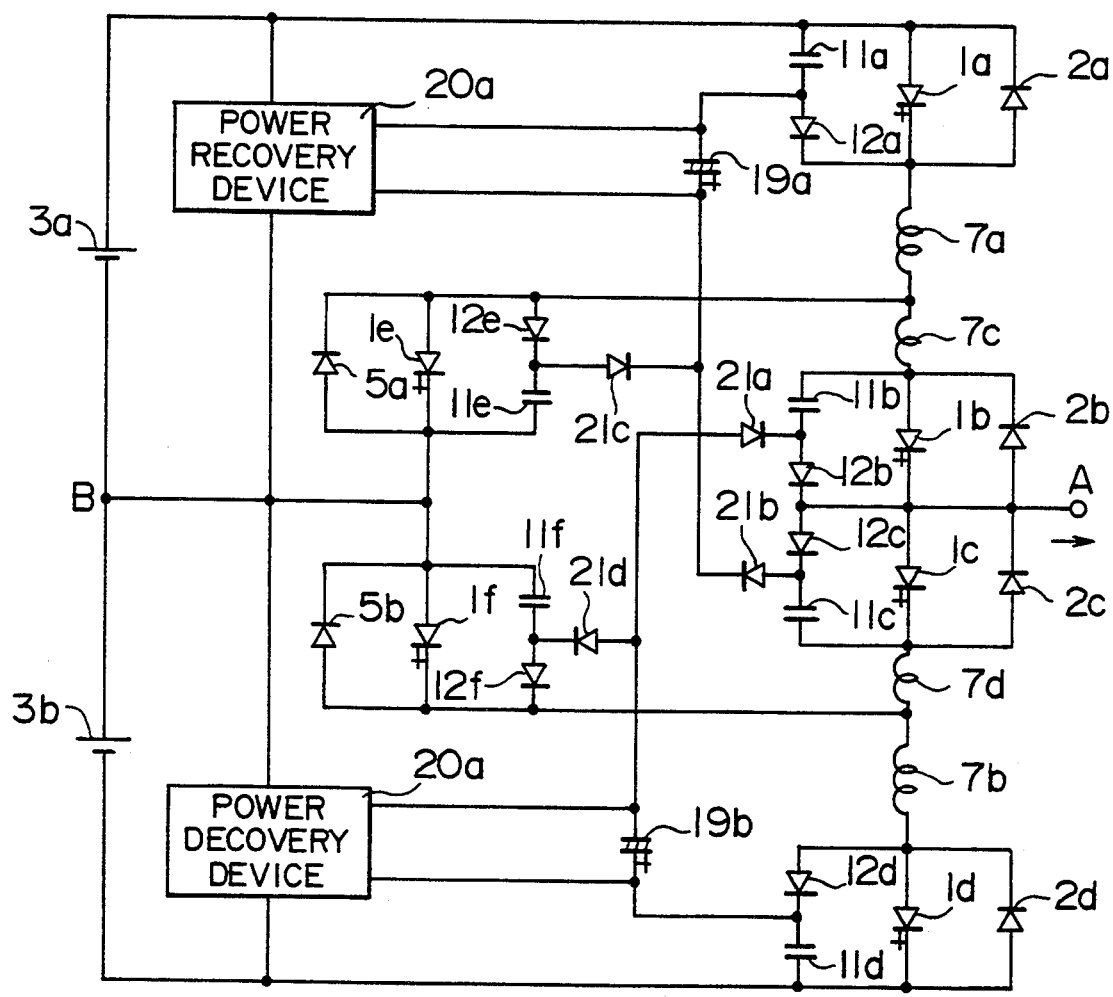

In the operation following turning off of the GTO 1a, the rate of rise of the current in the GTO 1a caused by the turning on of the GTO 1c may become excessively large. In order to avoid this problem, it is possible to adopt a structure as shown in FIG. 9 or 10, by inserting auxiliary reactors 7c, 7d. More specifically, in the arrangement shown in FIG. 9, the auxiliary reactors 7c and 7d are connected in series between the GTO 1b and the GTO 1c, and the output terminal A is derived from the grounding point of this series connection. In the arrangement shown in FIG. 10, the auxiliary reactor 7c is connected between the reactor 7a and the GTO 1b and the auxiliary reactor 7d is connected between the reactor 7b and the GTO 1c. Obviously, it is possible to utilize the inductance of the wiring. In most cases, however, when the GTO 1c is turned on, the voltage applied to the GTO 1c is considerably lower than the voltage E of the division 3a of the D.C. power supply, due to discharging from the snubber capacitor 11c. In addition, the value of the rush current itself is considerably low. Consequently, the voltage applied to the GTO is within the range over which the GTO can operate safely.

When the load current is flowing in the direction reverse to that of the arrow in this Figure, the operations caused by switching of the GTOs 1a, 1b, 1c and 1d are exactly symmetrical with those described above. Detailed description is therefore omitted in regard to the operations performed when the load current is flowing in the direction reverse to the direction of the arrow.

Figure 11:
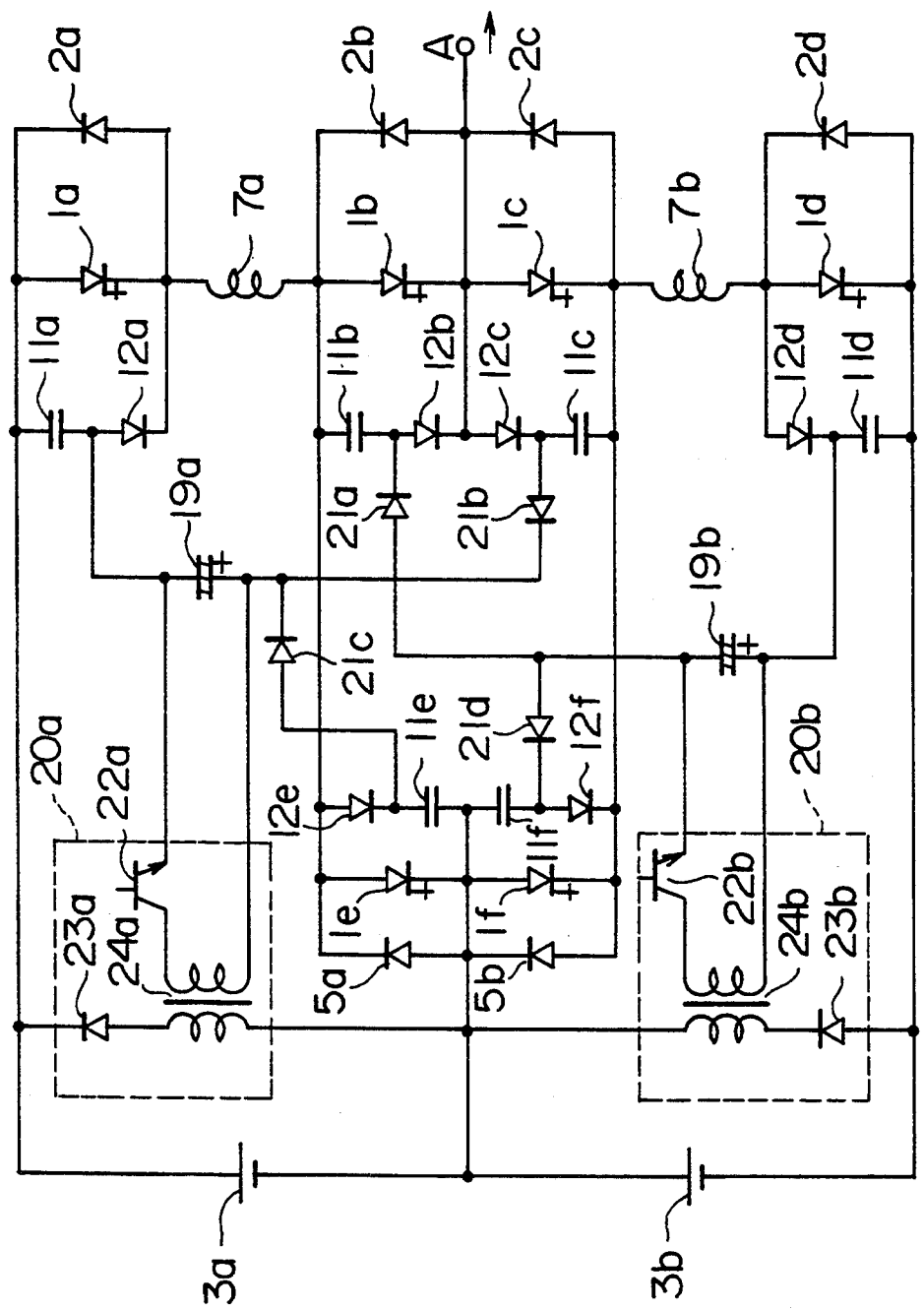
FIG. 11 is a circuit diagram of the fourth embodiment including a practical circuit of a power recovery device.

A description will not be given of the power recovery devices 20a, 20b. Each of the power recovery devices 20a, 20b is not essential in the invention of this application but is effective in constituting the inverter apparatus of the invention when connected to the circuit of FIG. 7. FIG. 11 exemplarily illustrates a practical example of the circuitry of the power recovery device known as back-type converter. It is possible to attain, using this known circuit for example, the function of the recovery device 20a, 20b, i.e., recovery of energy from the recovery capacitor 19a, 19b of the predetermined charging polarity to, for example,the D.C. power supply 3a, 3b so as to control the charging voltage of the recovery capacitors 19a, 19b to a constant level. The operation of the circuit shown in FIG. 11 will be described as to the case of the positive arm. As the first step, the self-arc-suppressing semiconductor device 22a is turned on so as to cause the energy in the recovery capacitor 19a to be discharged therefrom. In this state, no electrical current flows in the secondary side of a transformer 24a since backward voltage is applied to the diode 23a. Consequently, the discharged energy is stored in the transformer 24a. Then, the self-arc-suppressing semiconductor device 22a is turned off to interrupt the discharge current, so that electrical currentis induced in the secondary side of the transformer 24 due to the energy stored in the transformer 24a, whereby the energy is recovered to the division 3a of the D.C. power supply 3a. It is possible to maintain the charging voltage of the recovery capacitor 19a at a constant level by controlling the on or off period of the self-arc-suppressing semiconductor device 22a or period of switching of the same, by varying the voltage of the recovery capacitor 19a. The operation of the recovery device in regard to the negative arm is not described because it is materially the same as that for the positive arm. The circuit shown in FIG. 11 is only illustrative, and it will be clear to those skilled in the art that an equivalent effect can be obtained when other known D.C.—D.C. power converter circuit is used in place of the circuit of FIG. 11. The same advantage also is obtained when the combination of the recovery capacitor and the power recovery device is replaced with a potential device of the type having its primary side connected to the self-arc-suppressing semiconductor device and secondary side connected to a diode bridge circuit network.

A description will now be given of a fifth embodiment of the present invention.

Figure 12:
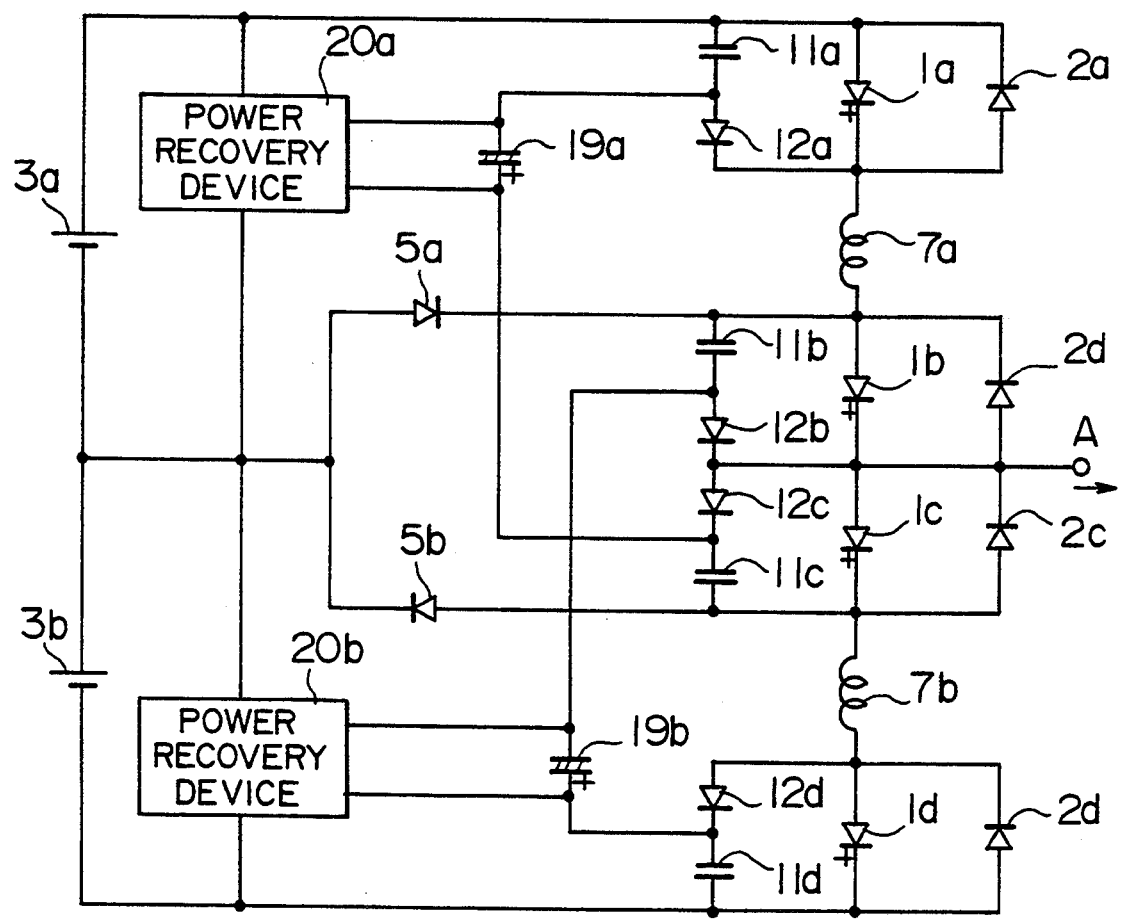
FIGS. 12 to 16 are circuit diagrams showing constructions of fifth to ninth embodiments of the present invention.

In the 3-level inverter apparatus of the fifth embodiment shown in FIG. 12, thyristors (GTOs) 1a, 1b, 1c and 1d are used, by way of example, as the self-arc-suppressing devices 1a, 1b, 1c and 1d. Briefly, this 3-level inverter apparatus is formed by incorporating the recovery capacitors 19a, 19b and power recovery devices 20a, 20b of the fourth embodiment in the 3-level inverter apparatus of the first embodiment. Thus,the energy which is consumed by the discharge resistors 18a, 18b in the embodiment of FIG. 1 is recovered by recovery capacitors 19a, 19b shown in FIG. 12. The basic operation of the circuit of this embodiment is not described in detail because it is materially the same as that in the first embodiment.

A description will now be given of a sixth embodiment of the present invention.

Figure 13:
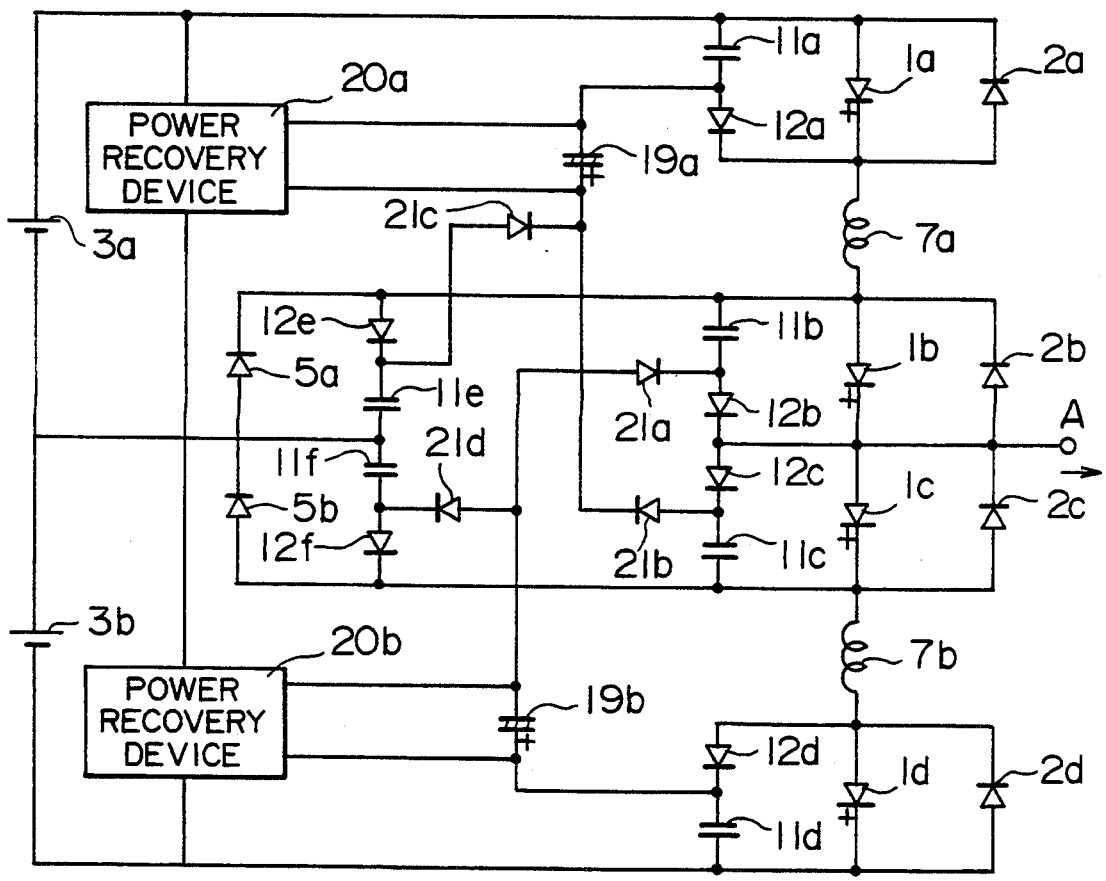
Figure 14:
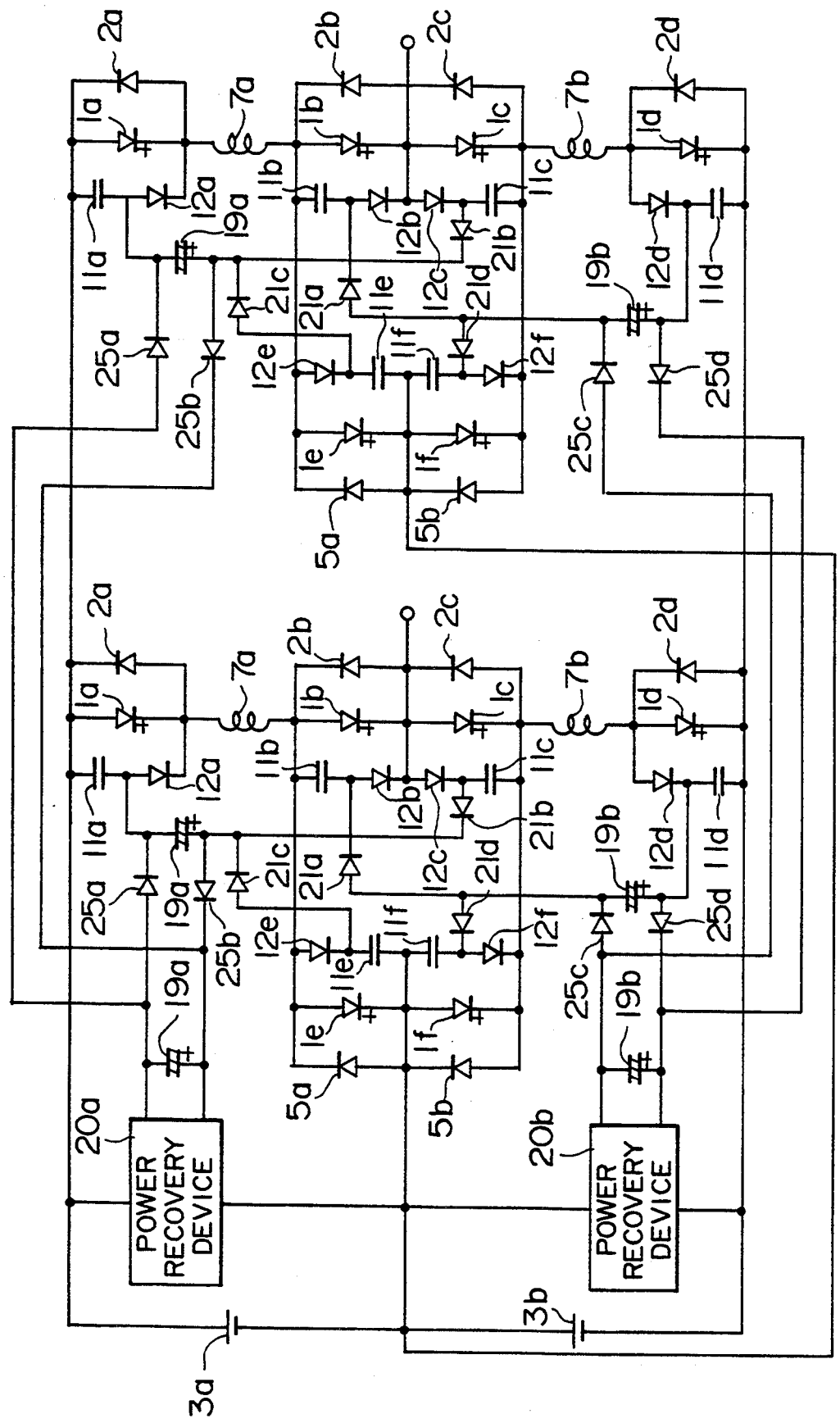

In the 3-level inverter apparatus of the sixth embodiment shown in FIG. 13, thyristors (GTOs) 1a, 1b, 1c and 1d are used, by way of example, as the self-arc-suppressing devices 1a, 1b, 1c and 1d. Briefly, this 3-level inverter apparatus is formed by incorporating the recovery capacitors 19a, 19b and power recovery devices 20a, 20b of the fourth embodiment in the 3-level inverter apparatus of the third embodiment. Thus, the energy which is consumed by the discharge resistors 18a, 18b in the embodiment of FIG. 5 is recovered by recovery capacitors 19a, 19b shown in FIG. 13. The basic operation of the circuit of this embodiment is not described in detail because it is materially the same as that in the third embodiment.

A description will now be given of a seventh embodiment of the present invention.

In the 3-level inverter apparatus of the seventh embodiment shown in FIG. 34, thyristors (GTOs) 1a, 1b, 1c and 1d are used, by way of example, as the self-arc-suppressing devices 1a, 1b, 1c and 1d. Briefly, this 3-level inverter apparatus is characterized in that the power recovery devices 20a, 20b, are connected commonly for a plurality of phases, in order to form a multi-phase inverter apparatus based on the 3-level inverter apparatus of the fourth embodiment. The basic operation of the circuit of this embodiment is materially the same as that in the third embodiment and, therefore, is not described. In this embodiment, it is possible to stabilize the circuit operation by adding diodes 25a, 25b, 25c and 25d which determine the directions of discharge from the respective recovery capacitors 19a, 19b.

Figure 15:
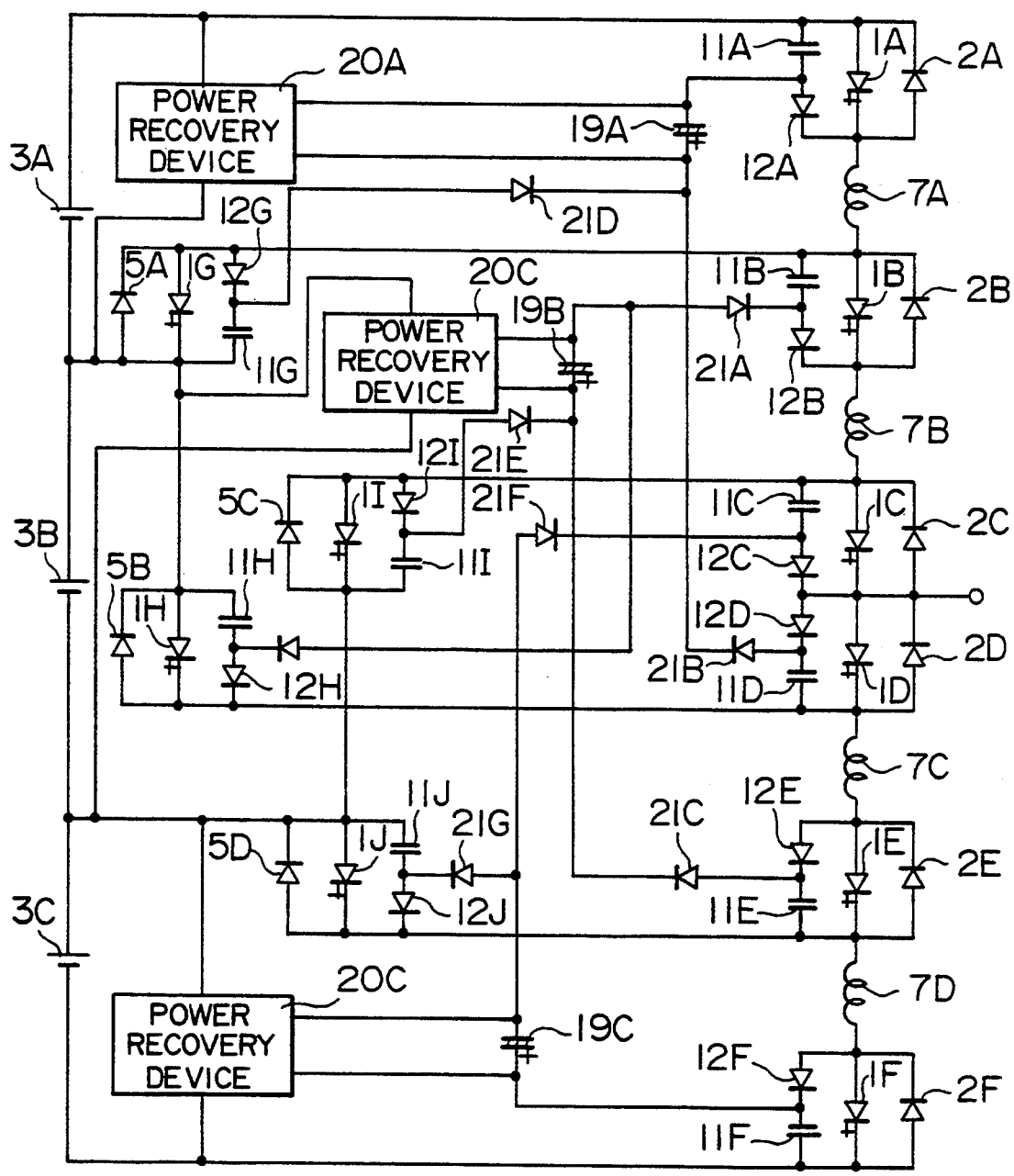
Figure 16:
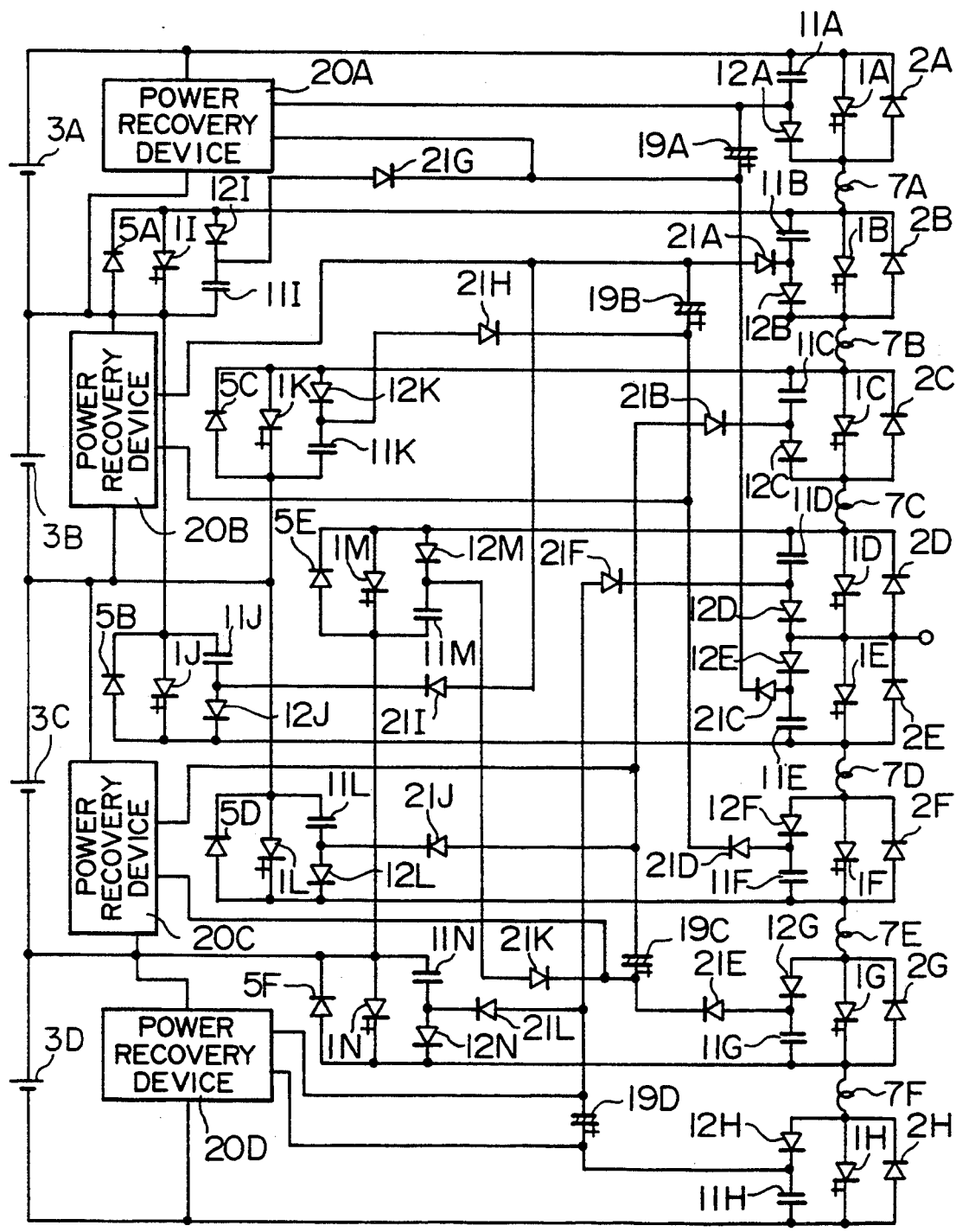

FIGS. 15 and 16 respectively show the constructions of eighth and ninth embodiments of the multi-level inverter apparatus of the present invention. Each Figure shows only the construction for one phase, for the purpose of clarification of the drawings. In each of these embodiments, GTOs are used,by way of example, as the self-arc-suppressing semiconductor devices. More specifically, the eighth embodiment shown in FIG. 15 is a 4-level inverter apparatus, while the ninth embodiment shown in FIG. 16 is a 5-level inverter apparatus. The basic constructions of the circuits of the eighth and ninth embodiments have been obtained by expanding the circuit employed in the fourth embodiment described before in connection with FIG. 7. The operations of these embodiments also are materially the same as that of the fourth embodiment, so that detailed description is omitted.

What is claimed is:

1. An inverter apparatus, comprising:

first and second self-arc-suppressing semiconductor devices connected in series between a positive electrode of a D.C. power supply having a mid-potential point and an output terminal;

a first reactor connected between said first and second semiconductor devices and forming, in cooperation with said first and second semiconductor devices, a positive arm;

third and fourth self-arc-suppressing semiconductor devices connected in series between a negative electrode of said D.C. power supply and said output terminal;

a second reactor connected between said third and fourth semiconductor devices and forming, in cooperation with said third and fourth semiconductor devices, a negative arm;

a first diode connected between one end of said first reactor and said mid-potential point of said D.C. power supply in forward direction with respect to said output terminal;

a second diode connected between one end of said second reactor and the mid-potential point of said D.C. power supply in backward direction with respect to said output terminal;

first to fourth series connections each including a diode and a capacitor connected in series to each other, said first to fourth series connections being connected in parallel with said first to fourth semiconductor devices, respectively;

a first discharge resistor connected between the point where said diode and said capacitor of said first series connection are connected to each other and the point where said diode and said capacitor of said third series connection are connected to each other; and a second discharge resistor connected between the point where said diode and said capacitor of said second series connection are connected to each other and the point where said diode and said capacitor of said fourth series connection are connected to each other.

2. An inverter apparatus according to claim 1, further comprising:

a fifth series connection including a diode and a capacitor connected in series to each other, said fifth series connection being connected in parallel with said first diode;

a sixth series connection including a diode and a capacitor connected in series to each other, said sixth series connection being connected in parallel with said second diode;

a line which electrically connects one end of said first discharge resistor to the point where said diode and said capacitor of said fifth series connection are connected to each other; and a line which electrically connects one end of said second discharge resistor to the point where said diode and said capacitor of said sixth series connection are connected to each other.

3. An inverter apparatus according to claim 2, further comprising:

a fifth self-arc-suppressing semiconductor device connected in parallel with said first diode; and a sixth self-arc-suppressing semiconductor device connected in parallel with said second diode.

4. An inverter apparatus according to claim 1, characterized in that said inverter apparatus is a 3-level inverter.

5. An inverter apparatus, comprising:

first and second self-arc-suppressing semiconductor devices connected in series between a positive electrode of a D.C. power supply having a mid-potential point and an output terminal;

a first reactor connected between said first and second semiconductor devices and forming, in cooperation with said first and second semiconductor devices, a positive arm;

third and fourth self-arc-suppressing semiconductor devices connected in series between a negative electrode of said D.C. power supply and said output terminal;

a second reactor connected between said third and fourth semiconductor devices and forming, in cooperation with said third and fourth semiconductor devices, a negative arm;

a first diode connected between one end of said first reactor and said mid-potential point of said D.C. power supply in forward direction with respect to said output terminal;

a second diode connected between one end of said second reactor and the mid-potential point of said D.C. power supply in backward direction with respect to said output terminal;

first to fourth series connections each including a diode and a capacitor connected in series to each other, said first to fourth series connections being connected in parallel with said first to fourth semiconductor devices, respectively;

a first recovery capacitor connected between the point where said diode and said capacitor of said first series connection are connected to each other and the point where said diode and said capacitor of said third series connection are connected to each other;

a second recovery capacitor connected between the point where said diode and said capacitor of said second series connection are connected to each other and the point where said diode and said capacitor of said fourth series connection are connected to each other;

a first power recovery device connected in parallel with said first recovery capacitor and adapted to recover energy from said first recovery capacitor to the D.C. power supply; and a second power recovery device connected in parallel with said second recovery capacitor and adapted to recover energy from said second recovery capacitor to the D.C. power supply.

6. An inverter apparatus according to claim 5, further comprising:

a fifth series connection including a diode and a capacitor connected in series to each other, said fifth series connection being connected in parallel with said first diode;

a sixth series connection including a diode and a capacitor connected in series to each other, said sixth series connection being connected in parallel with said second diode;

a line which electrically connects one end of said first recovery capacitor to the point where said diode and said capacitor of said fifth series connection are connected to each other; and a line which electrically connects one end of said second recovery capacitor to the point where said diode and said capacitor of said sixth series connection are connected to each other.

7. An inverter apparatus according to claim 6, further comprising:

a fifth self-arc-suppressing semiconductor device connected in parallel with said first diode; and a sixth self-arc-suppressing semiconductor device connected in parallel with said second diode.

8. An inverter apparatus according to claim 5, wherein each of said first and second power recovery devices includes a back-type converter.

9. An inverter apparatus according to claim 5, characterized in that said inverter apparatus is a 3-level inverter.

10. An inverter apparatus according to claim 5, characterized in that said inverter apparatus is a multi-level inverter.

11. An inverter apparatus, comprising:

a positive arm including a series connection between a positive electrode of a D.C. power supply and an output terminal, the series connection of the positive arm including in an order recited a first self-arc-suppressing semiconductor device, a first reactor, a second self-arc-suppressing semiconductor device;

a negative arm including a series connection between a negative electrode of said D.C. power supply and said output terminal, the series connection of the negative arm including in an order recited a third self-arc-suppressing semiconductor device, a second reactor, and a fourth self-arc-suppressing semiconductor device;

first to fourth series connections each including a diode and a capacitor connected in series to each other, said first to fourth series connections being connected in parallel with said first to fourth semiconductor devices, respectively;

a first recovery capacitor connected between the point wherein said diode and said capacitor of said first series connection are connected to each other and the point where said diode and said capacitor of said third series connection are connected to each other;

a second recovery capacitor connected between the point where said diode and said capacitor of said second series connection are connected to each other and the point where said diode and said capacitor of said fourth series connection are connected to each other;

a first power recovery device connected in parallel with said first recovery capacitor and adapted to recover energy from said first recovery capacitor to the D.C. power supply; and a second power recovery device connected in parallel with said second recovery capacitor and adapted to recover energy from said second recovery capacitor to the D.C. power supply.

12. The inverter apparatus of claim 11, wherein said self-arc-suppressing semiconductor devices are thyristors.

13. The inverter apparatus of claim 12, wherein each said thyristor is connected in a direction relative to a cathode of said thyristor with an anode of said thyristor toward said positive electrode of said D.C. power supply.

14. The inverter apparatus of claim 11, wherein said self-arc-suppressing semiconductor devices of said positive arm are connected with an opposite polarity to said self-arc-suppressing semiconductor devices of said negative arm, relative to said outpost terminal.

* * * * *